United States Patent [19]

Iwamatsu et al.

[11] Patent Number: 5,619,053

[45] Date of Patent: Apr. 8, 1997

[54] SEMICONDUCTOR DEVICE HAVING AN SOI STRUCTURE

[75] Inventors: Toshiaki Iwamatsu; Yasuo Inoue; Tadashi Nishimura, all of Hyogo, Japan

[73] Assignee: Mitsubishi Denki Kabushiki Kaisha, Tokyo, Japan

[21] Appl. No.: 454,816

[22] Filed: May 31, 1995

[51] Int. Cl.$^6$ .................................................. H01L 27/01
[52] U.S. Cl. ........................... 257/347; 257/345; 257/349; 257/351; 257/354
[58] Field of Search ...................................... 257/344, 345, 257/347, 349, 350, 351, 352, 353, 354

[56] References Cited

U.S. PATENT DOCUMENTS 5,343,051  8/1994  Yamaguchi et al. ..................... 257/347
5,440,161  8/1995  Iwamatsu et al. ....................... 257/351

FOREIGN PATENT DOCUMENTS 5-121681  5/1993  Japan ..................................... 257/351

*Primary Examiner*—Sara W. Crane
*Assistant Examiner*—Minhloan Tran
*Attorney, Agent, or Firm*—Oblon, Spivak, McClelland, Maier & Neustadt, P.C.

[57] ABSTRACT

Generation of parasitic transistor in active layer edge is prevented, in an NMOS region of a semiconductor layer (21) on an insulating film (20), boron ions are implanted by rotary oblique injection, using a nitride film (23) and a resist (253a) as mask. In the vicinity of a region for separating element by LOCOS method, that is, only in the edge region of the semiconductor layer (21) as the active layer of NMOS transistor, boron ions are implanted by about $3\times10^{13}/cm^2$. After LOCOS oxidation, the impurity concentration is heightened to such a level as the boron ions may not be sucked up into the oxide film.

2 Claims, 48 Drawing Sheets

PMOS REGION    NMOS REGION

BORON CONCENTRATION ($/cm^3$)

DISTANCE

SEMICONDUCTOR DEVICE HAVING AN SOI STRUCTURE

BACKGROUND OF THE INVENTION

1. Field of the Invention

The present invention relates to a semiconductor device and a manufacturing method thereof, and more particularly to a semiconductor device formed on an insulating film and its manufacturing method.

2. Description of the Background Art

To enhance the performance of a semiconductor, it has been attempted to manufacture a semiconductor integrated circuit of a small floating capacity by separating a circuit element by a dielectric. Generally, in a manufacturing method of semiconductor, a so-called LOCOS method is employed for separating a circuit element. Each transistor separated in this separating method is formed in a completely insulated semiconductor layer, and hence it is reported to have many benefits, such as freedom from effect of latch-up with adjacent transistor.

FIG. 66 to FIG. 90 are sectional view showing such conventional manufacturing method of semiconductor in the sequence of steps.

First, as shown in FIG. 66, a semiconductor layer 21 on an insulating film 20 is oxidized in a wet atmosphere at about 950° C., and an oxide film 22 is formed in a thickness of 300 angstroms. On this oxide film 22, further, a nitride film 23 is formed in a thickness of 500 angstroms by CVD method (FIG. 66).

Next, as shown in FIG. 67, applying a resist 249a, it is patterned in a desired shape. Then, by dry etching, the nitride film 23 and oxide film 22 are removed. Consequently, as shown in FIG. 68, a resist 249b is patterned (double coated) only in a region for forming a PMOS transistor (hereinafter PMOS region), and boron ions are implanted in a region for forming an NMOS transistor (hereinafter NMOS region). The boron implantation amount is $3\times10^{13}/cm^2$, and the implantation energy is 20 keV. By this implantation, a high concentration impurity region 206 is formed in the semiconductor layer 21 (edge region of active layer) of the NMOS region not covered with the nitride film 23. Then the resists 249a, 249b are removed (FIG. 69).

By oxidizing the semiconductor layer 21 in wet atmosphere for 60 minutes at 950° C., an oxide film 25 is formed (hereinafter such oxide film forming technique is mentioned as LOCOS oxidation). At this time, the nitride film 23 is used as mask when oxidizing, and the oxide film 25 is formed only in the region not covered with it (FIG. 70). The nitride film 23 is then removed by hot phosphoric acid in the condition of 160° C. and 30 minutes (FIG. 71).

Next, as shown in FIG. 72, a resist 249c is formed only in the PMOS region, and boron ions are implanted in the NMOS region. The implantation energy is 20 keV, and the implantation amount is $3\times10^{12}/cm^2$. The implantation is for channel doping, and is applied for setting the threshold voltage of the NMOS transistor. Afterwards, the resist 249c is removed.

Similarly, forming a resist 249d in the NMOS region, boron ions are implanted in the PMOS region by $3\times10^{11}/cm^2$ with an energy of 20 keV. This ion implantation is intended to set the threshold voltage of the PMOS transistor.

Removing the resist 249d, polysilicon 27 containing phosphorus at $10\times10^{19}/cm^3$ is formed in a thickness of 3000 angstroms, and a resist 249e is patterned on the polysilicon 27 in a shape of gate wiring (FIG. 74). Using the resist 249e as mask, the polysilicon 27 is etched and gate wiring is obtained, and then the resist 249e is removed (FIG. 75).

Forming a resist 249f in the PMOS region, phosphorus ions are implanted in the NMOS region by $1\times10^{14}/cm^2$ with an energy of 20 keV. As a result, an N⁻ region 30 is formed in the NMOS region (FIG. 76). Removing the resists 249f, a resist 249g is formed in the NMOS region. In the PMOS region, boron ions are implanted by $1\times10^{13}/cm^2$ with an energy of 20 keV, and a P⁻ region 31 is formed in the PMOS region (FIG. 77). These ion implantations are intended to form LDD regions for the NMOS transistor and PMOS transistor, respectively.

Removing the resist 249g, as shown in FIG. 78, an oxide film 32 formed by using TEOS (tetraethyl orthosilicate) (hereinafter TEOS film) is formed in a thickness of 1500 angstroms. When it is removed by dry etching in a strong anisotropic gas atmosphere, the TEOS film 32 is left over in a width of 1500 angstroms only on the side wall of the polysilicon 27 left over as gate wiring (FIG. 79).

Consequently, as shown in FIG. 80, forming a resist 249h in the PMOS region, arsenic ions are implanted in the NMOS region by $4\times10^{15}/cm^2$ with an energy of 20 keV. As a result, an N⁺ region 33 is formed. Removing the resist 249h, a resist 249i is formed in the NMOS region. In the PMOS region, boron ions are implanted by $5\times10^{15}/cm^2$ with an energy of 20 keV, and a P⁺ region 34 is formed. By these ion implantations, source/drain regions are formed in the NMOS transistor and PMOS transistor, respectively.

Removing the resist 249i (FIG. 82), a Ti film 35 is sputtered in a thickness of 200 angstroms (FIG. 83). By lamp annealing for 30 seconds at 700° C., a compound 36 of silicon and titanium is formed only on the N⁺ region 33 and P⁺ region 34 which are source/drain regions. Removing the unreacted TI film 35, lamp annealing is repeated at 950° C. for 30 seconds. The compound 36 is stabilized by this lamp annealing (FIG. 84).

Then, as shown in FIG. 85, a TEOS film 37 is formed in a thickness of 1500 angstroms. Applying a resist 249j, it is patterned to open a region for removing the TEOS film 37, that is, a contact region on the N⁺ region 33 and P⁺ region 34 (FIG. 86). Using the resist 249j as mask, the TEOS film 37 is removed by dry etching, and the compound 36 in the contact region is exposed (FIG. 87).

On the entire surface of the structure thus obtained, an aluminum film 39 is formed (FIG. 88). As shown in FIG. 89, consequently, patterning a resist 249k in a wiring shape, the aluminum film 39 is patterned by dry etching. FIG. 90 is a sectional view of the CMOS transistor completed in this process.

Thus formed NMOS transistor should, by nature, present an ideal sub-threshold characteristic. However, a parasitic transistor is formed in the edge of the oxide film 25 obtained by LOCOS oxidation. This is because, as shown in FIG. 69 to FIG. 71, the boron ions implanted in the semiconductor layer 21 as SOI layer are not diffused into the inside of the semiconductor 21 functioning as channel in LOCOS oxidation at 950° C., but are sucked into the oxide film 25, thereby lowering the boron ion concentration of the semiconductor layer 21 near the oxide film 25.

When a parasitic transistor is formed around the SOI active layer in this way, instead of presenting the desired transistor characteristic, a hump is formed in the sub-threshold characteristic.

SUMMARY OF THE INVENTION

To solve the problems, the invention presents a semiconductor device comprising (a) a semiconductor layer, and (b)

an insulating film formed beneath the semiconductor layer, and having a higher impurity concentration near the semiconductor layer than the semiconductor layer.

In particular, it further comprises (c) a separating region for partitioning the semiconductor layer to an activation region. Both of the impurity concentration in the semiconductor layer near the separating region and that in the insulating film near the semiconductor layer sufficiently remote from the separating region are higher as compared with an impurity concentration of the semiconductor layer sufficiently remote from the separating region.

A first aspect of a manufacturing method of semiconductor device of the invention comprises steps of (a) preparing a formed semiconductor layer on an insulating film, and (b) conducting an introduction of an impurity for giving a higher concentration distribution in the insulating film, as compared with that of the semiconductor layer.

A second aspect of the manufacturing method of semiconductor device of the invention further comprises, prior to the step (b), a step of (c) forming a separating region for partitioning the semiconductor layer into an activation region. The introduction of the impurity is to give a concentration distribution, as compared with that of the semiconductor layer sufficiently remote from the separating region, high in the semiconductor layer near the separating region, and high in the insulating film positioned beneath the semiconductor layer sufficiently remote from the separating region.

A third aspect of the manufacturing method of semiconductor device of the invention comprises steps of (a) preparing a semiconductor layer having an active region and a separating region, (b) introducing an impurity into the separating region, (c) diffusing the impurity into a vicinity of the separating region, and (d) forming an insulating separating element in the separating region.

A fourth aspect of the manufacturing method of semiconductor device of the invention comprises steps of (a) preparing a semiconductor layer having an active region and a separating region, (b) introducing an impurity into the separating region obliquely to the normal of the semiconductor layer, and (c) forming an insulting separating element in the separating region.

Preferably, it further comprises, prior to the step (c), a step of (d) diffusing the impurity into a vicinity of the separating region.

A fifth aspect of the manufacturing method of semiconductor device of the invention comprises steps of (a) preparing a semiconductor layer having an active region and a separating region, (b) introducing a first impurity into the separating region, (c) forming an insulating separating element in the separating region, and (d) introducing a second impurity into the active region obliquely to the normal of the semiconductor layer.

Preferably, it further comprises, prior to the step (c), a step of (e) diffusing the first impurity into a vicinity of the separating region.

A sixth aspect of the manufacturing method of semiconductor device of the invention comprises steps of (a) preparing a semiconductor layer having an active region and a separating region, (b) forming an insulating separating element in the separating region, (c) introducing an impurity into the semiconductor layer, and (d) heating the semiconductor layer to diffuse the impurity, thereby recovering from defects in the semiconductor layer near the separating element.

The insulating film of the semiconductor device of the invention prevents effects of parasitic transistor. Moreover, since the impurity concentration of the semiconductor layer near the separating region is high, generation of parasitic transistor is also suppressed.

The insulating layer heightened in the impurity concentration in the first aspect of manufacturing method of semiconductor device of the invention prevents effects of parasitic transistor.

The semiconductor layer heightened in the impurity concentration in the second aspect of manufacturing method of semiconductor device of the invention prevents effects of parasitic transistor.

The semiconductor layer heightened in the impurity concentration in the third aspect of manufacturing method of semiconductor device of the invention compensates for absorption of impurity by the separating element.

The introduction of impurity in an oblique direction in the fourth aspect of manufacturing method of semiconductor device of the invention expands the impurity concentration heightened area in the semiconductor layer.

The introduction of second impurity in an oblique direction in the fifth aspect of manufacturing method of semiconductor device of the invention expands the impurity concentration heightened area in the semiconductor layer.

The heat treatment in the sixth aspect of manufacturing method of semiconductor of the invention recovers from the defects in the separating element and prevents generation of parasitic transistor.

Thus the invention presents a semiconductor device suppressed in generation and effects of parasitic transistor.

It is therefore an object of the present invention to provide a semiconductor device capable of suppressing generation and effect of parasitic transistor, and exhibiting a normal sub-threshold characteristic, there by solving the problems in the prior art.

These and other objects, features, aspects and advantages of the present invention will become more apparent from the following description of the present invention when taken in conjunction with the accompanying drawings.

DESCRIPTION OF THE PREFERRED EMBODIMENTS

First Preferred Embodiment

Figure 1:
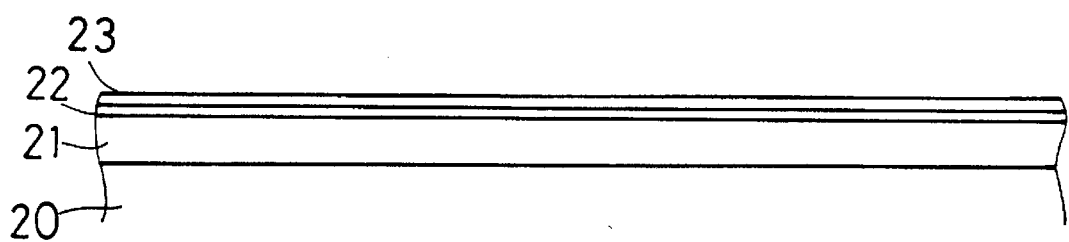
FIGS. 1 to 25 are sectional view for explaining a first preferred embodiment in a process sequence.
Figure 2:
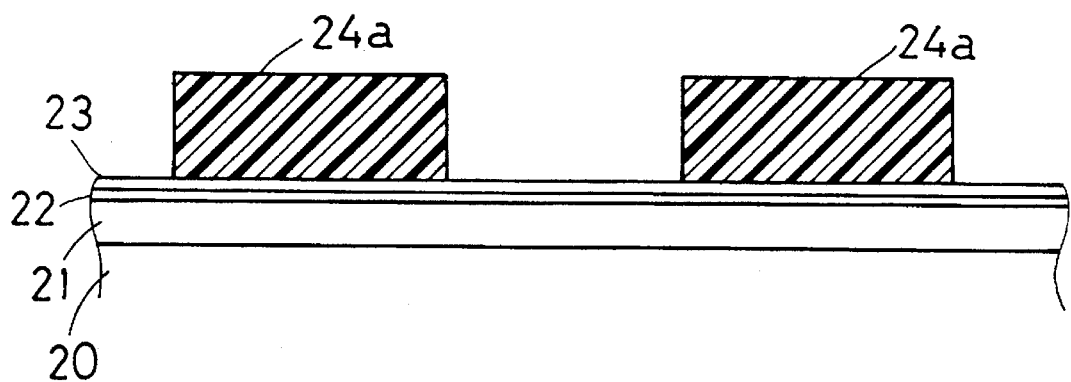
Figure 3:
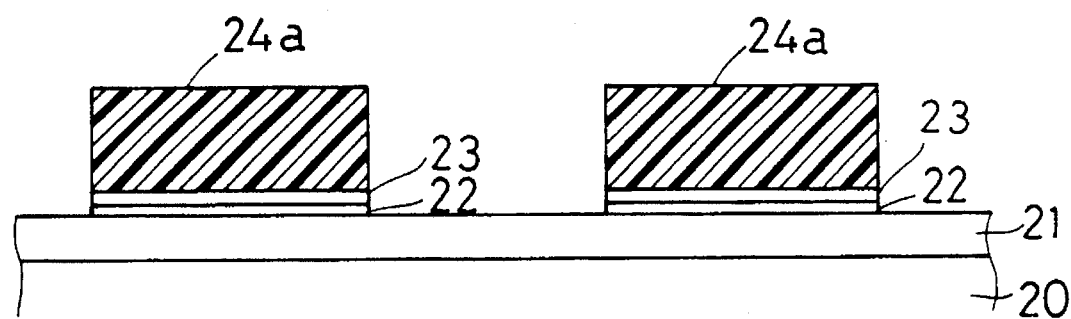

FIG. 1 to FIG. 25 are sectional views showing a first preferred embodiment of the invention in the sequence of steps. As shown in FIG. 1, a semiconductor layer 21 is formed on an insulating film 20 in a thickness of about 1000 angstroms. The semiconductor layer 21 is oxidized in a wet atmosphere of about 950° C., and an oxide film 22 is formed in a thickness of 100 angstroms. On this oxide film 22, a nitride film 23 is formed in a thickness of 500 angstroms by CVD method. Then, as shown in FIG. 2, a resist 24a is applied, and is patterned in a shape of a field for forming a transistor. They are selectively removed by dry etching, leaving only the nitride film 23 and oxide film 22 immediately beneath the resist 24a (FIG. 3), and then the resist 24a is removed.

Figure 4:
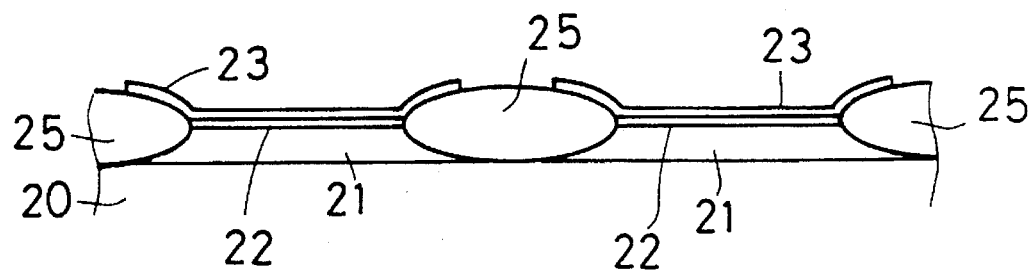
Figure 5:
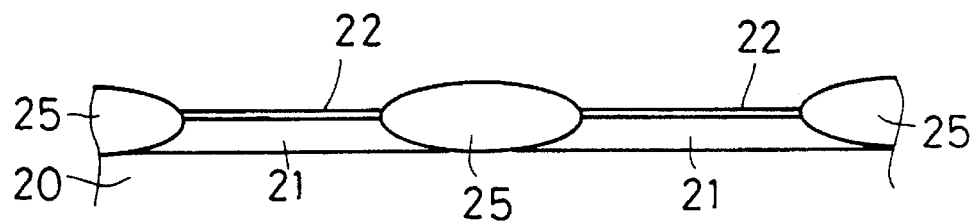

As shown in FIG. 4, consequently, the semiconductor layer 21 is selectively oxidized in a wet atmosphere at 950° C., and an oxide film 25 is formed. At this time, in the existing region of nitride film 23, the semiconductor layer 21 is not oxidized because the nitride film 23 functions as mask. The nitride film 23 is then removed by hot phosphoric acid (FIG. 5).

Figure 6:
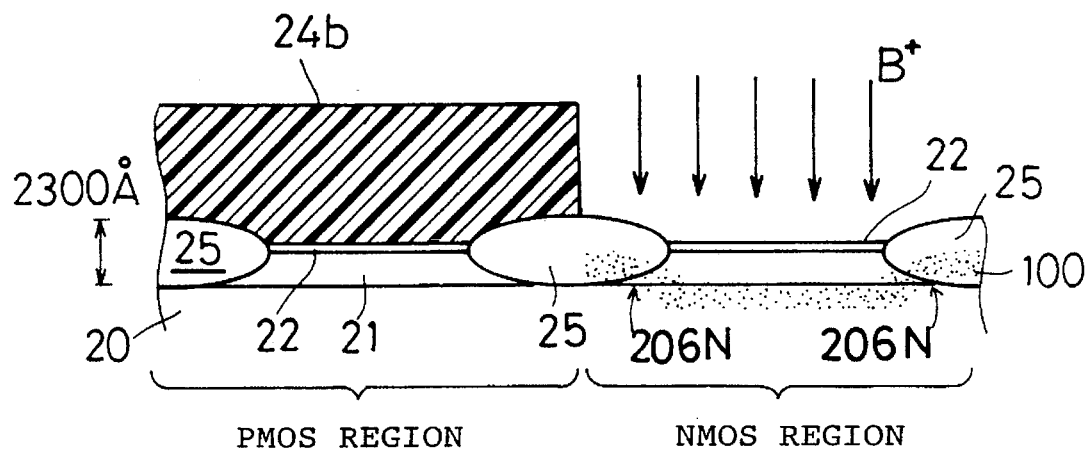

Next, as shown in FIG. 6, a resist mask 24b is formed only in the PMOS region, and boron ions are implanted in the NMOS region for channel cutting.

The implantation energy at this time is determined so that the ion implantation peak 100 may be present in the insulating film 20 in a region not forming oxide film 25, and layer 21 in the semiconductor near the oxide film 25. More specifically, boron ions are implanted so that the boron concentration may be high in a region 206N which is a part of the semiconductor layer 21 near the oxide film 25. In the region 206N, the thickness of the semiconductor layer 21 is less than the thickness before formation of the oxide film 25. The thickness of the semiconductor layer 21 is 1000 angstroms before the oxidation, and when the oxide film 25 is formed as being oxidized entirely in the thickness direction of the semiconductor layer 21, the thickness of the oxide film 25 is about 2300 angstroms. In this case, the implantation energy is set at about 35 keV. The boron ion implantation amount is $3 \times 10^{13}/cm^2$.

Figure 7:
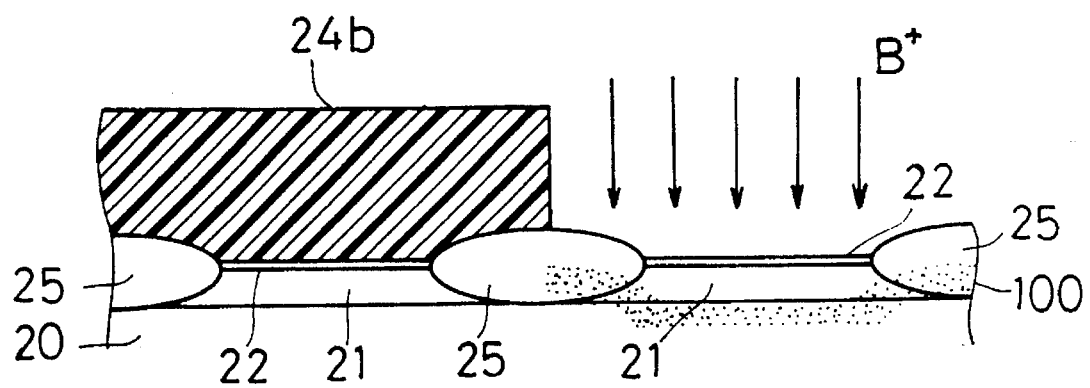

Then, with an energy of 20 keV, boron ions are implanted by $3 \times 10^{12}/cm^2$ (FIG. 7). This implantation is for channel doping, and is for setting the threshold voltage of the NMOS transistor. The resist 24b is removed after boron ion implantation.

Figure 8:
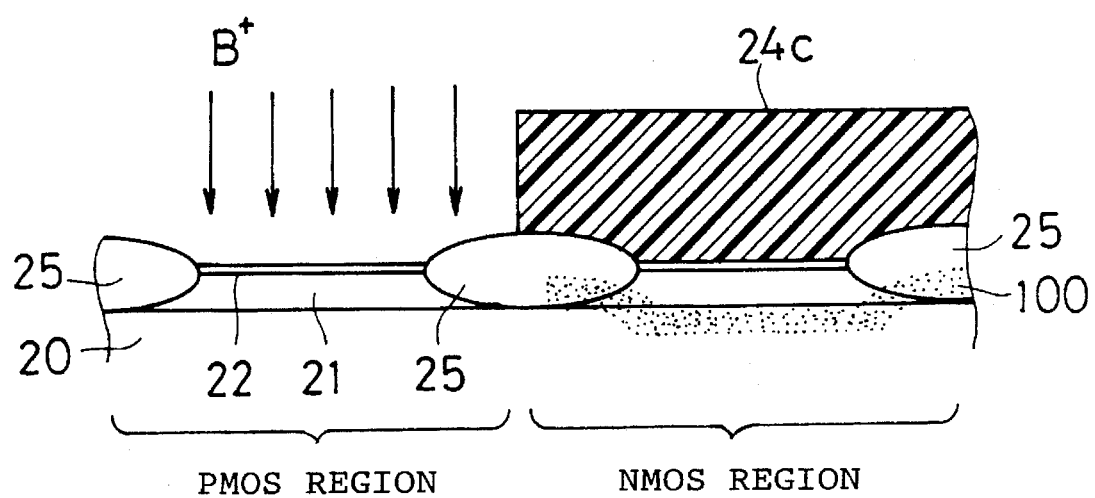

Then, as shown in FIG. 8, a resist 24c is formed in the NMOS region, and boron ions are implanted in the PMOS region by 20 keV, $3 \times 10^{11}/cm^2$. This implantation is for setting the threshold voltage of the PMOS transistor.

Figure 9:
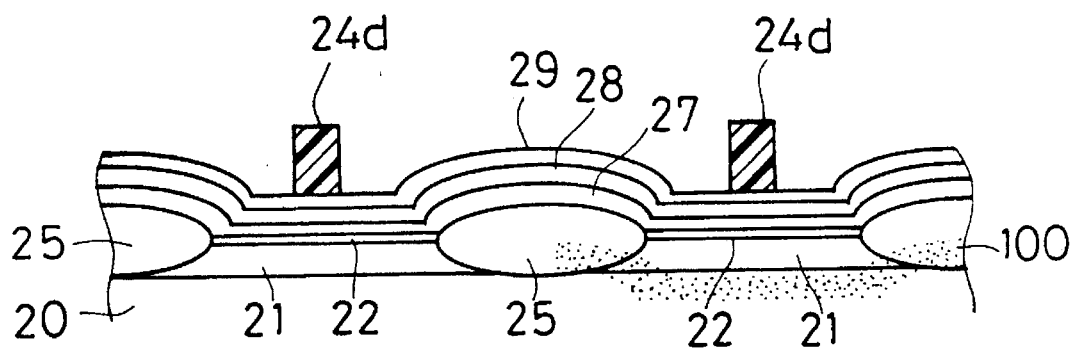
Figure 10:
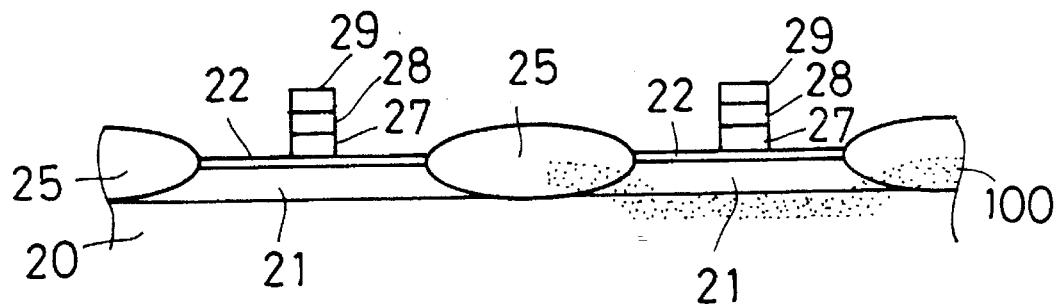

After removing the resist 24c, polysilicon 27 containing phosphorus by $10 \times 10^{19}/cm^3$ is formed in a thickness of 1200 angstroms. Further, a WSi 28 is formed on the polysilicon 27 in a thickness of 1200 angstroms by sputtering method, and a TEOS film 29 is formed on the WSi 28 in a thickness of 1000 angstroms. On the TEOS film 29, a resist 24d is patterned in a shape corresponding to gate wiring (FIG. 9). Using the resist 24d as mask, the TEOS film 29 is removed by dry etching. Removing the resist 24d, and using the TEOS film 29 as mask, the polysilicon 27 and the WSi 28 are removed selectively by etching (FIG. 10). The remaining WSi 28 and polysilicon 27 function as gate wiring in each transistor.

Figure 11:
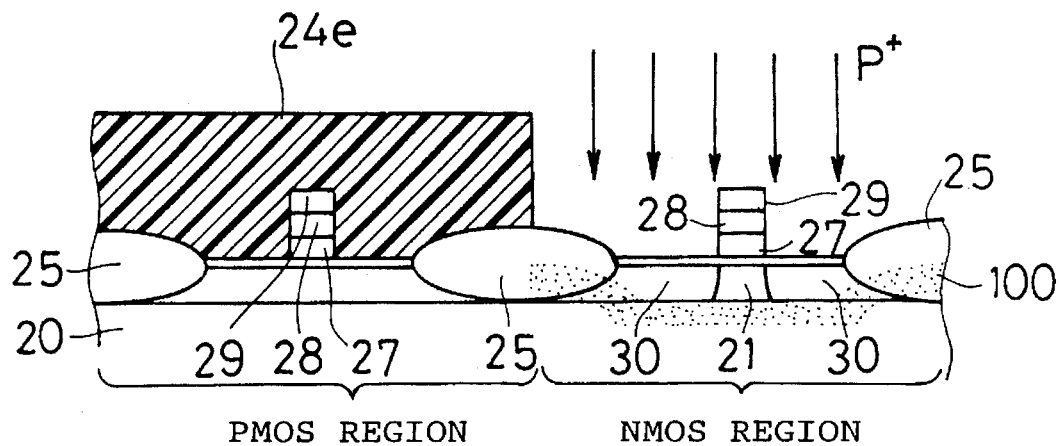
Figure 12:
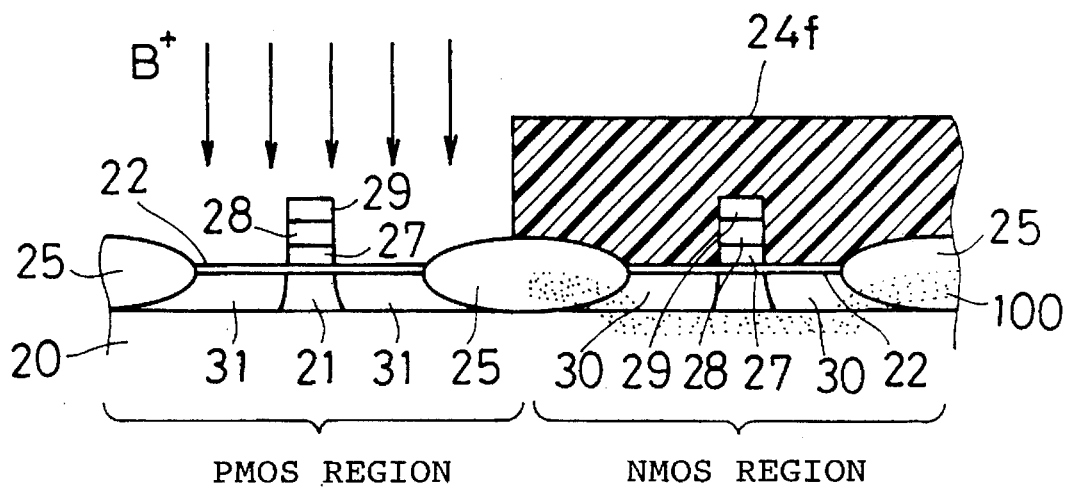

Forming a resist 24e in the PMOS region, and using the TEOS film 29, WSi 28, and polysilicon 27 as mask, phosphorus ions are implanted in the NMOS region by $1 \times 10^{13}/cm^2$ with an energy of 20 keV. By this implantation, an N$^-$ region 30 is formed (FIG. 11). Removing the resist 24e, a resist 24f is formed in the NMOS region, and boron ions are implanted in the PMOS region by $1 \times 10^{13}/cm^2$ with an energy of 20 keV. By this implantation, a P$^-$ region 31 is formed (FIG. 12). The process shown in FIG. 11 and FIG. 12 is intended to form an LDD region of NMOS transistor and PMOS transistor, respectively.

Figure 13:
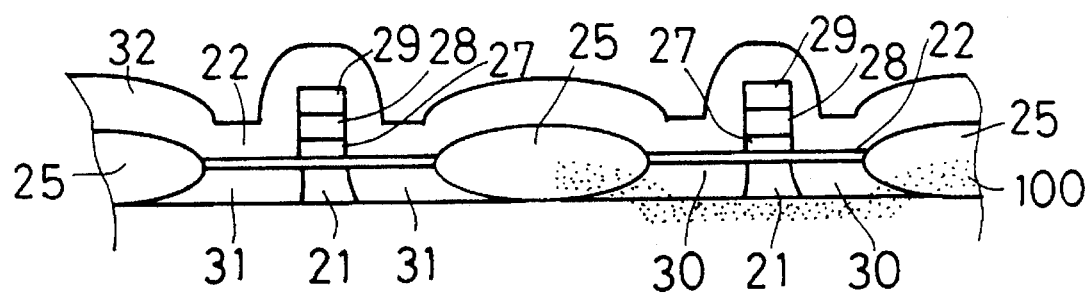
Figure 14:
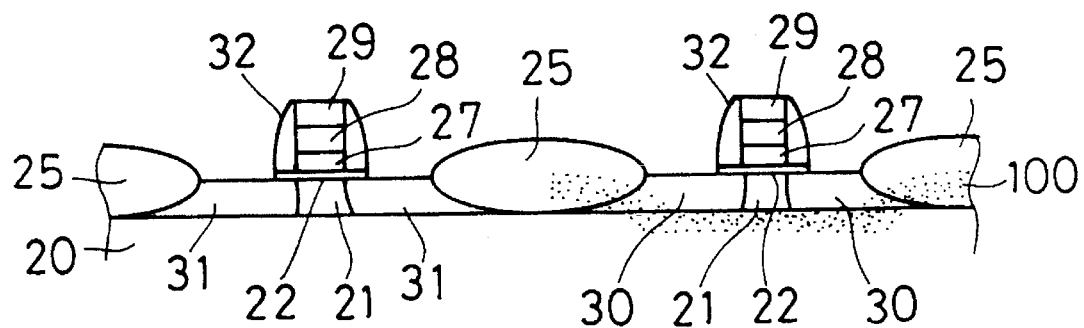

In consequence, removing the resist 24f, a TEOS film 32 is formed in a thickness of 1500 angstroms (FIG. 13). Then the TEOS film 32 is removed by dry etching in a strong anisotropic gas atmosphere. After this process, the TEOS film 32 in a width of 1500 angstroms is left over only on the side walls of the WSi 28 and polysilicon 27, both of which serve as the gate wiring, and TEOS film 29 (FIG. 14).

Figure 15:
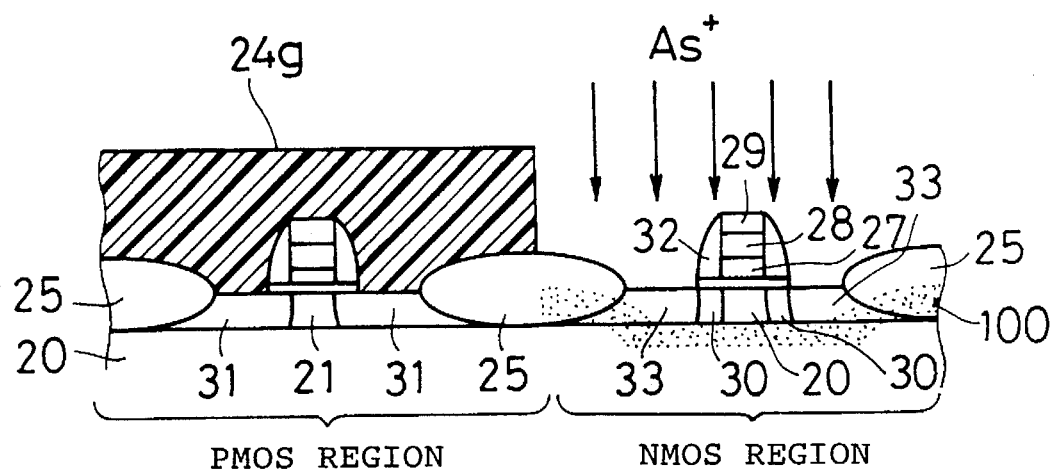
Figure 16:
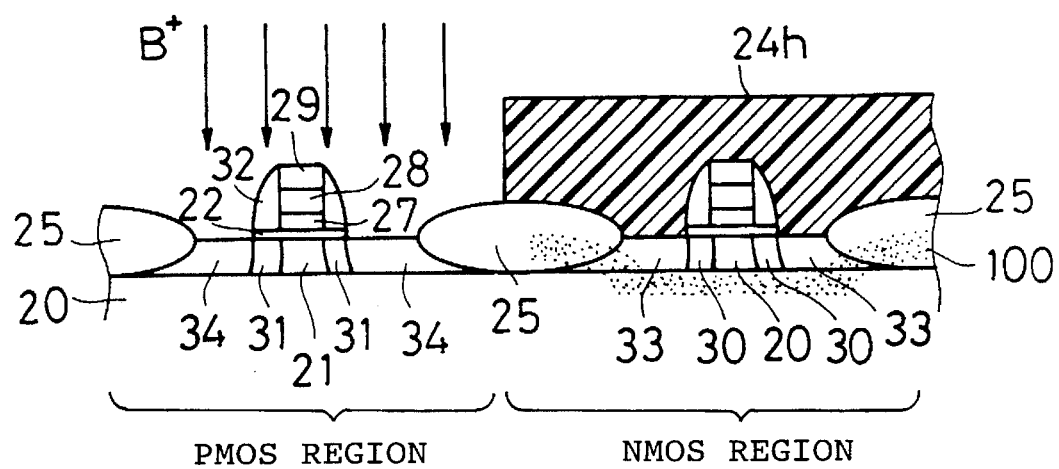
Figure 17:
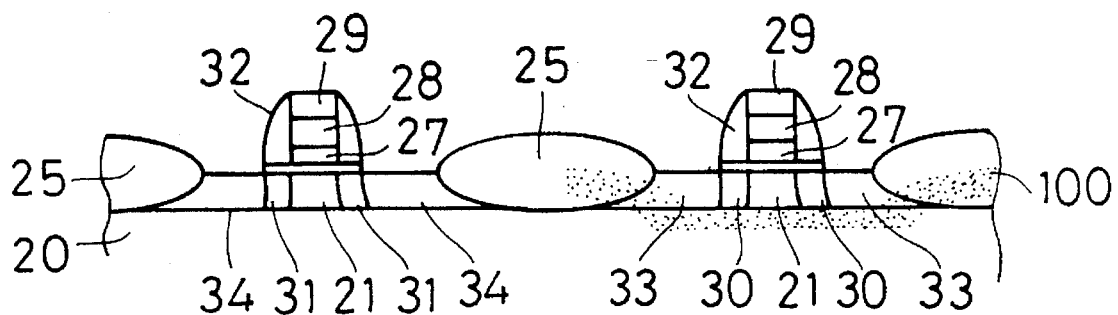

As shown in FIG. 15, forming a resist 24g in the PMOS region, arsenic ions are implanted in the NMOS region by $4 \times 10^{15}/cm^2$ with an energy of 20 keV. By this implantation, an N$^+$ region 33 is formed. Removing the resist 24g, a resist 24h is formed in the NMOS region. In the PMOS region, boron ions are implanted by $5 \times 10^{14}/cm^2$ with an energy of 20 keV. By this implantation, a P$^+$ region 34 is formed. The N$^+$ region 33 and P$^+$ region 34 function as the source/drain region of the NMOS transistor and PMOS transistor, respectively. Then the resist 24h is removed (FIG. 17).

Figure 18:
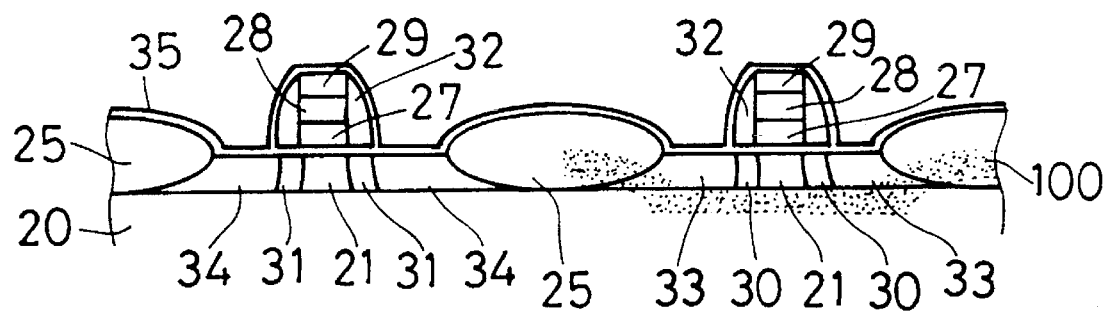
Figure 19:
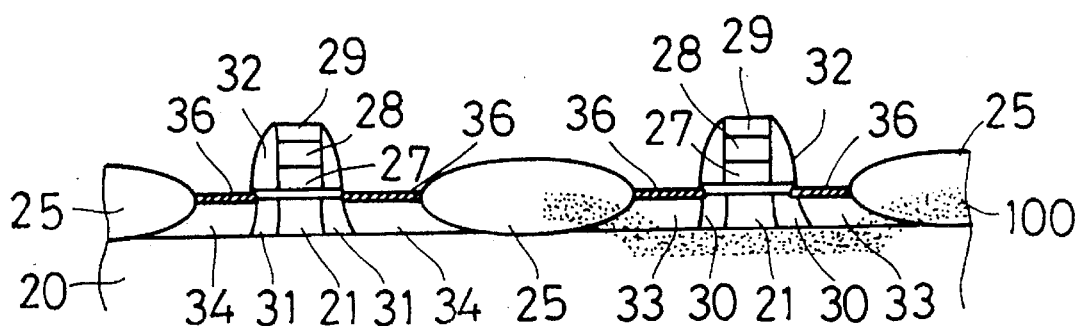
Figure 20:
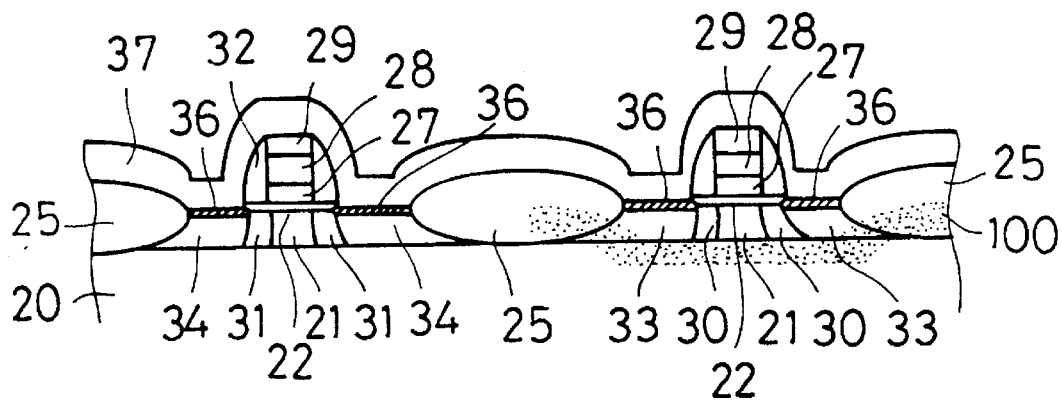

Successively, a Ti film 35 is formed in a thickness of 200 angstroms by sputtering (FIG. 18). Furthermore, by lamp annealing for 30 second at 700° C., a compound of silicon and titanium $TixSi_{(1-x)}$ is formed only on the N$^+$ region 33 and P$^+$ region 34. After removing the unreacted Ti film 35, lamp annealing is done again at 850° C. for 30 seconds. By this lamp annealing, the compound $TixSi_{(1-x)}$ is stabilized into $TiSi_2$ 36 (FIG. 19). Then a TEOS film 37 is formed in a thickness of 1500 angstroms (FIG. 20).

Figure 21:
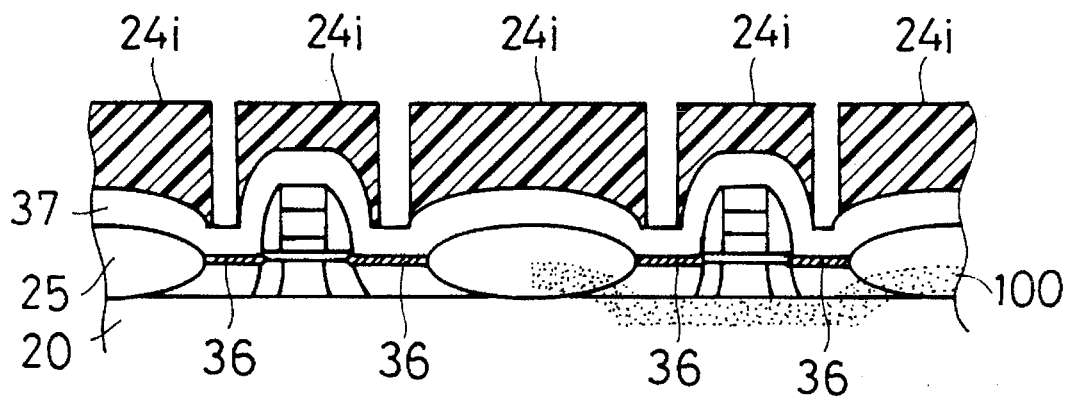
Figure 22:
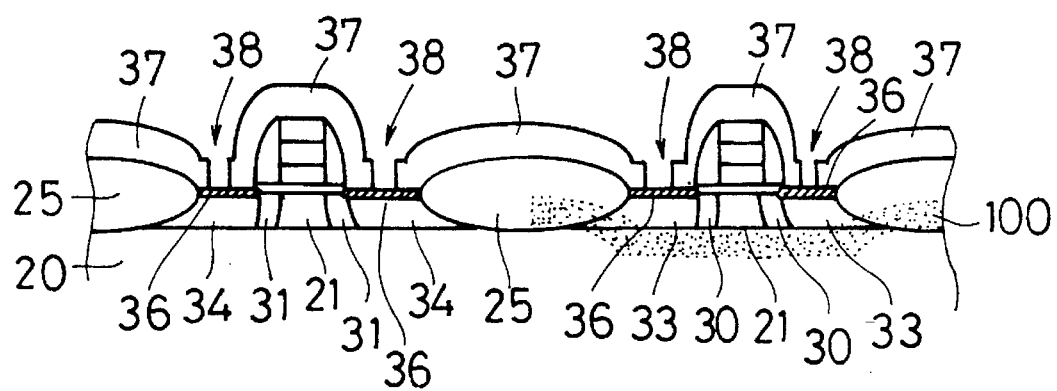
Figure 23:
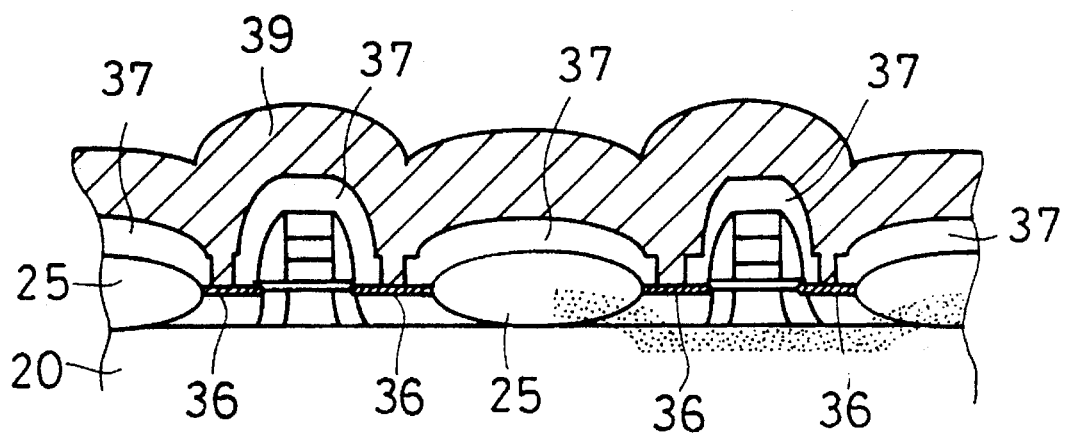
Figure 24:
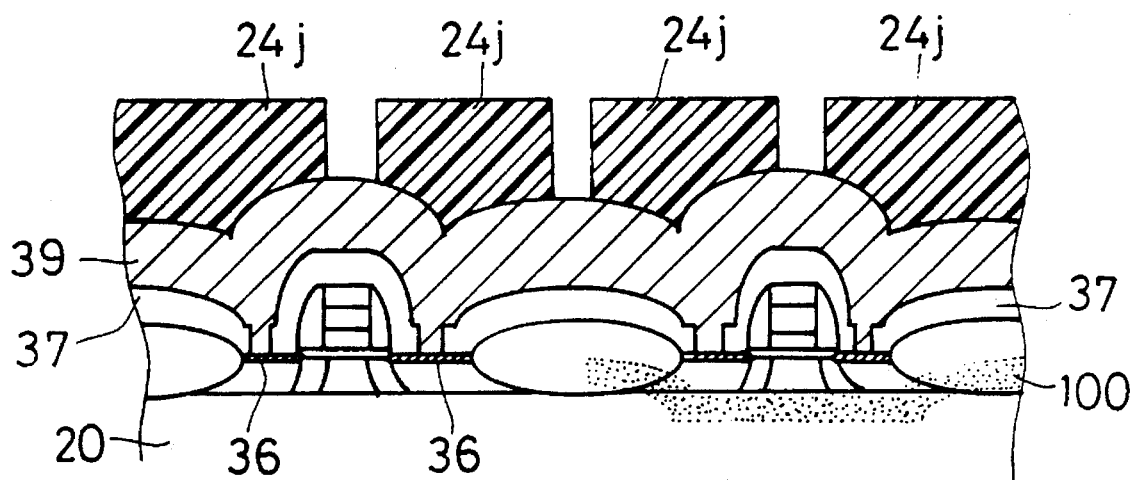

As shown in FIG. 21, applying a resist 24i, it is patterned so as to open above the $TiSi_2$ 36. Using the resist 24i as mask, a contact hole 38 is opened by dry etching, and the resist 24i is removed (FIG. 22). On the entire surface of the structure thus obtained, an aluminum film 39 is sputtered (FIG. 23).

Figure 25:
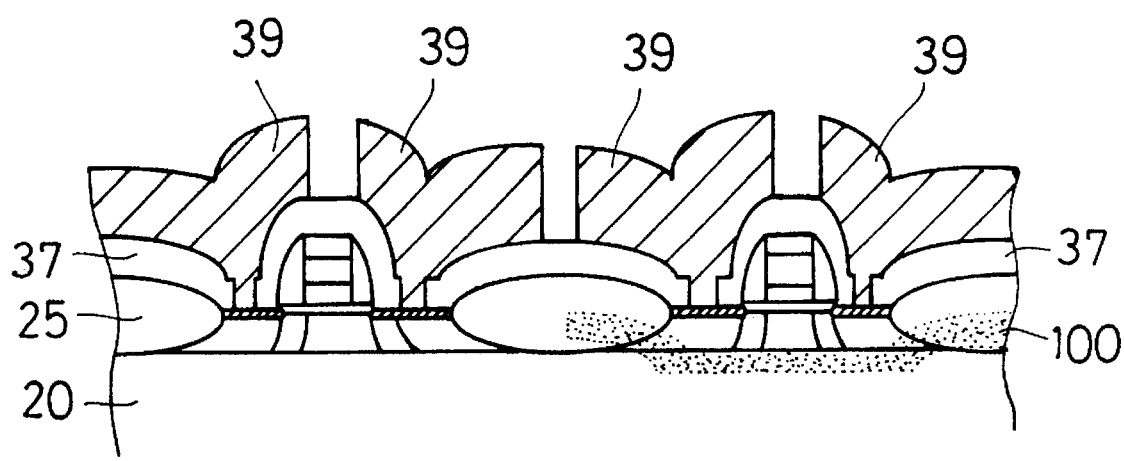

Furthermore, patterning a resist 24j in a same shape as drain and source wiring (FIG. 24), the aluminum film 39 is patterned by dry etching (FIG. 25).

Figure 26:
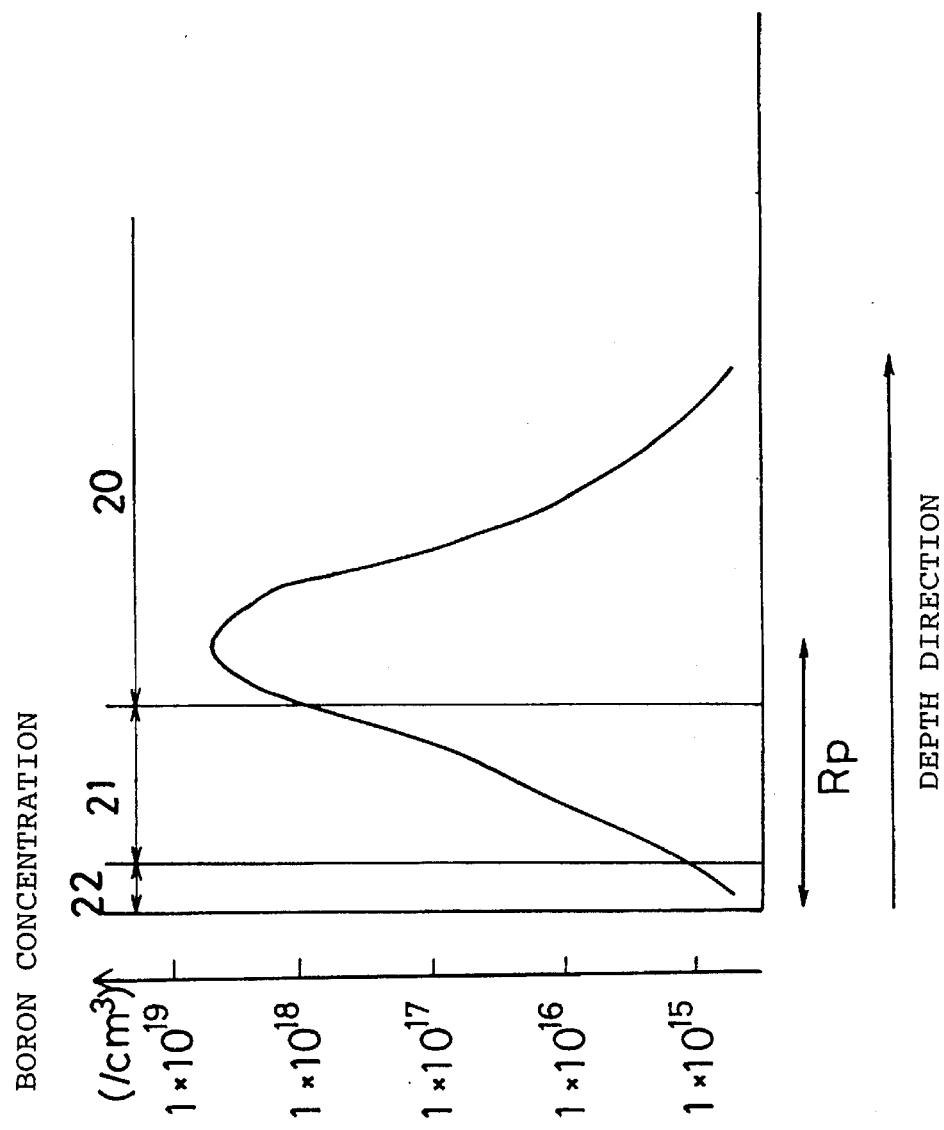
FIGS. 26 to 28 are graphs showing an impurity profile in the first preferred embodiment.

FIG. 26 is a graph showing an impurity profile in the channel after implantation of boron ions in the step shown in FIG. 6. The profile after ion implantation is generally a Gaussian distribution, with a tail drawn from the central position of implantation peak 100. This position of implantation peak 100 is called range RP, and it is within the insulating film 20 positioned below the semiconductor layer 21. Incidentally, since the oxide film 25 is formed by oxidizing the semiconductor layer 21, the film thickness is about two times thicker than the semiconductor layer 21, and hence the peak position in the vicinity of the oxide film 25 is inside of the semiconductor layer 21. In this way, when the implantation energy is set so that the implantation peak may be positioned in the insulating film 20 beneath the semiconductor layer 21, ions are not much injected into the channel area of the MOS transistor, but a high concentration region is formed in the semiconductor layer 21 near the oxide film 25.

Hence, in various heat treatments performed in the wafer process after ion implantation, if the oxide film 25 absorbs an impurity, the impurity concentration of the neighboring semiconductor layer 21 can be kept sufficiently high, so that generation of parasitic transistor may be suppressed.

Figure 27:
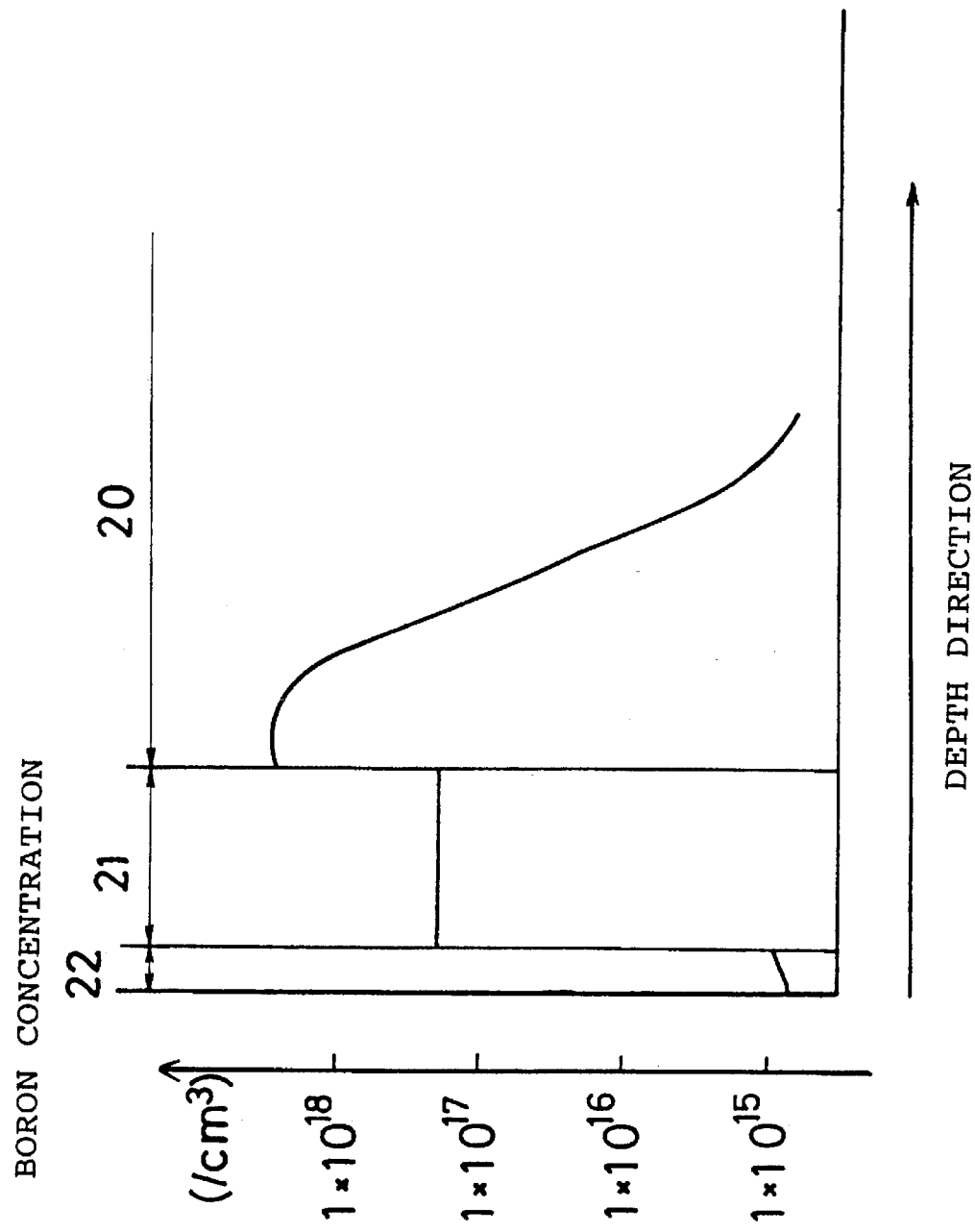

FIG. 27 is a graph showing an impurity profile after finishing the process up to FIG. 25. The diffusion coefficient of boron ions in the semiconductor layer 21 is about two digits larger than that of boron ions in the insulating film 20, and finally the impurity concentration shows a uniform profile in the film thickness direction in the semiconductor layer 21, and the impurity concentration of the insulating film 20 near the semiconductor layer 21 is higher than the impurity concentration of the semiconductor layer 21. Accordingly, if parasitic transistor is generated, its effect can be suppressed.

Figure 28:
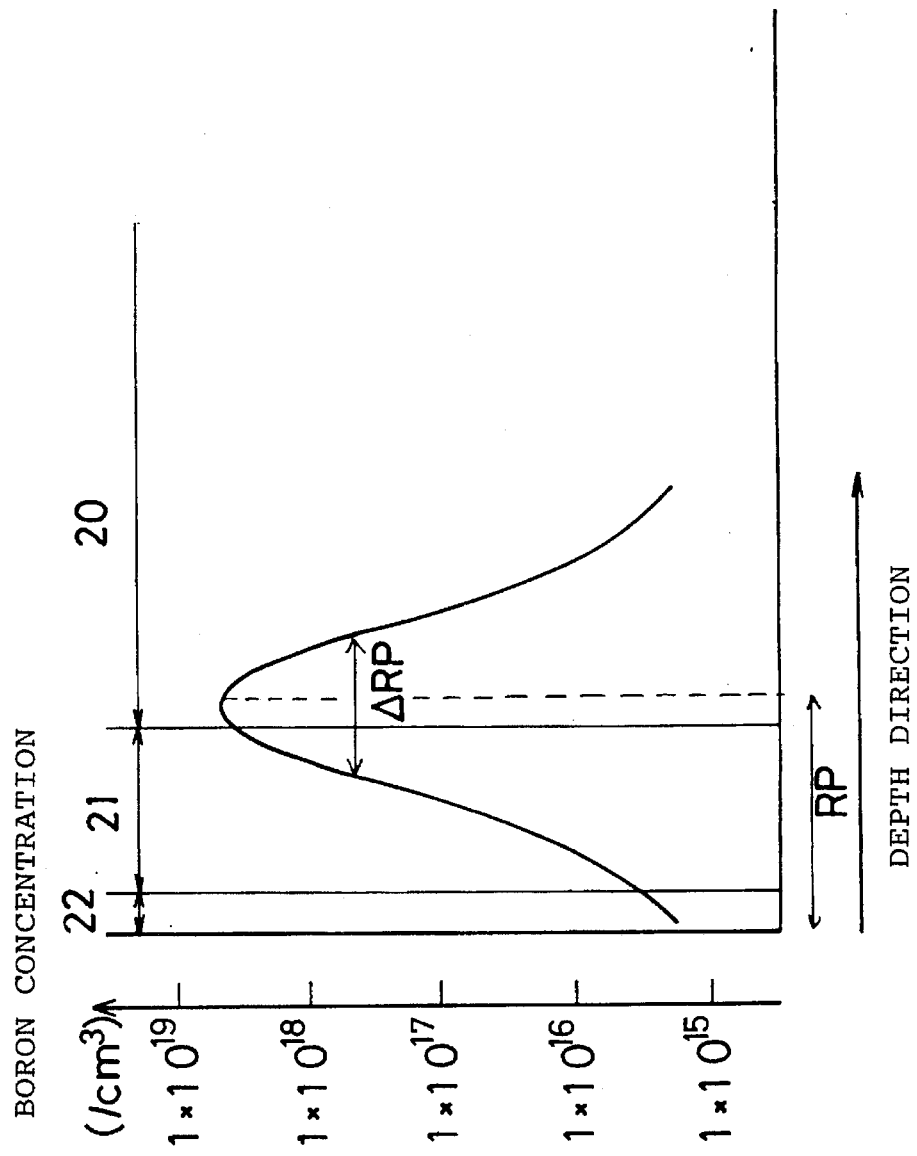

FIG. 28 is a graph showing an impurity profile in the channel after implanting boron ions in the step shown in FIG. 7. The range Rp of ion implantation is provided in the insulating film 20. At this time, assuming the graph to be a Gaussian distribution, the implantation energy is set so that the deviation ΔRp may also settle within the semiconductor layer 21. The impurity concentration of the region as the channel of MOS transistor (a region of the semiconductor layer 21 remote from the oxide film 25) is set by implantation of boron ions shown in FIG. 7, and therefore by setting the energy properly, the impurity concentration of the semiconductor layer 21 near the oxide film 25 can be heightened by the ion implantation in FIG. 6, and the channel concentration can be set at the same time. In this case, by one implantation, channel cut implantation and channel implantation can be effected simultaneously, so that the process of channel implantation of NMOS shown in FIG. 7 may be simplified.

Second Preferred Embodiment

Figure 29:
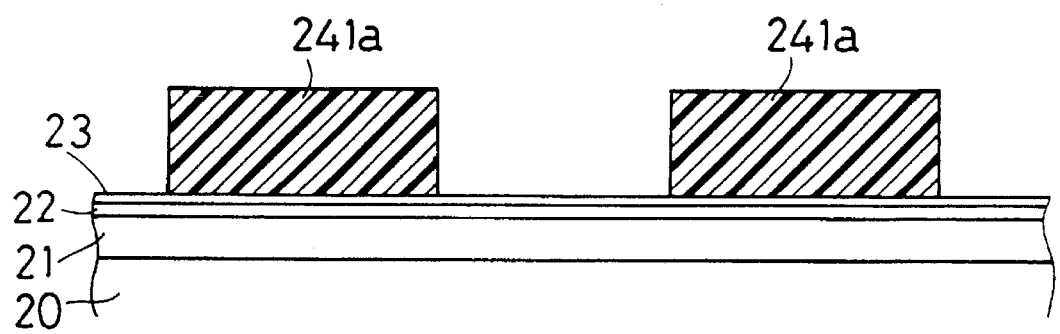
FIGS. 29 to 39 are sectional views for explaining a second preferred embodiment in a process sequence.
Figure 30:
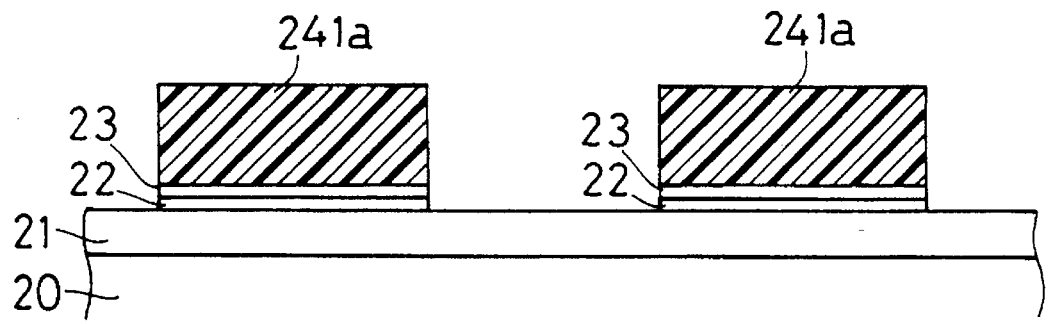

FIG. 29 to FIG. 36 are sectional views showing a second preferred embodiment of the invention in the sequence of steps. A semiconductor layer 21 on an insulating film 20 is oxidized in a wet atmosphere at about 950° C., and an oxide film 22 is formed in a thickness of 300 angstroms. On this oxide film 22, a nitride film 23 is formed in a thickness of 500 angstroms by CVD method. Applying a resist 241a, it is patterned in a shape of field for forming a transistor (FIG. 29). Using this resist 241a as mask, the nitride film 23 and oxide film 22 are removed by dry etching (FIG. 30), and the resist 241a is removed.

Figure 31:
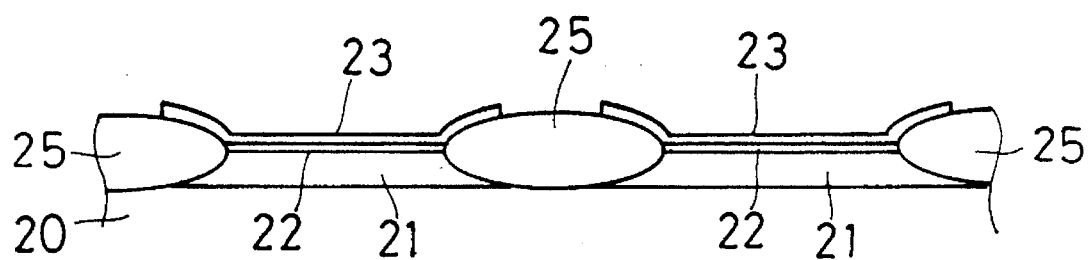
Figure 32:
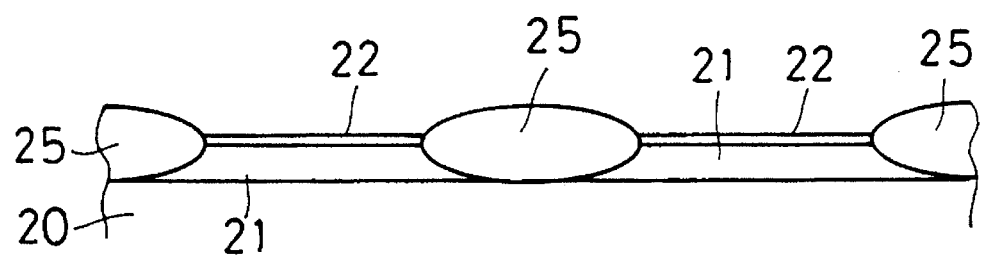

As shown in FIG. 31, by LOCOS oxidation of the semiconductor layer 21 in a wet atmosphere at 950° C., an oxide film 25 formed. When the nitride film 23 is present on the semiconductor layer 21, it is used as mask, and hence the semiconductor layer 21 is not oxidized (FIG. 31). Then the nitride film 23 is removed by hot phosphoric acid (FIG. 32).

Figure 33:
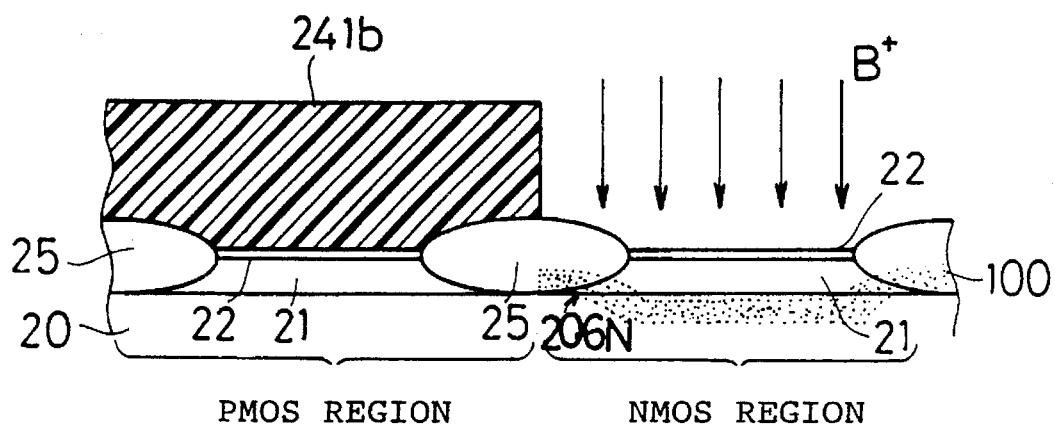

Then, as shown in FIG. 33, a resist 241b is formed only in the PMOS region, and boron ions are implanted in the NMOS region for channel cutting of NMOS transistor. The implantation energy at this time is determined so that the ion implantation peak 100 may be present in the insulating film 20 in the region not forming oxide film 25, and in the semiconductor layer 21 near the oxide film 25. More specifically, boron ions are implanted so that the boron concentration may be high in a region 206N which is a part of the semiconductor layer 21 near the oxide film 25. In the region 206N, the thickness of the semiconductor layer 21 is less than the thickness before formation of the oxide film 25 (FIG. 33). The thickness of the semiconductor layer 21 is 1000 angstroms, and when the oxide film 25 is formed as being oxidized entire in the thickness direction of the semiconductor layer 21, the thickness of the oxide film 25 is about 2300 angstroms. The implantation energy at this time is set at about 35 keV same as in the first preferred embodiment. The implantation amount of boron ions is $3\times10^{13}/cm^2$.

Figure 34:
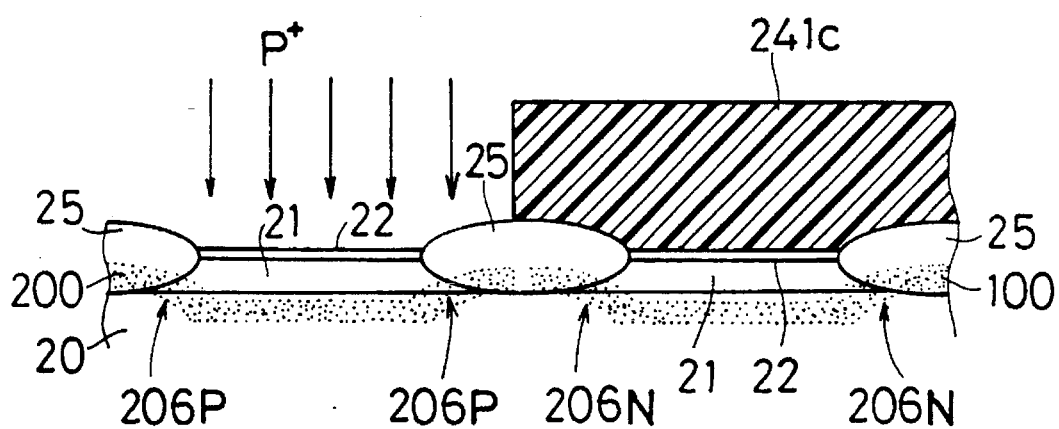

Removing the resist 241b, consequently, a resist 241c is formed only in the NMOS region. Using it as mask, phosphorus ions are implanted in the PMOS region by $3\times10^{13}/cm^2$ with an energy of 35 keV. This ion implantation is intended for channel cutting of the PMOS transistor, and same as in the ion implantation in the NMOS region, ions are implanted so that an implantation peak 200 occurs in the insulating film 20 in a region not forming oxide film 25. As a result, by implantation of boron or phosphorus ions, near the oxide film 25, the impurity concentration is high in regions 206P, 206N of the semiconductor layer 21 of which thickness is smaller than the original thickness (FIG. 34).

Figure 35:
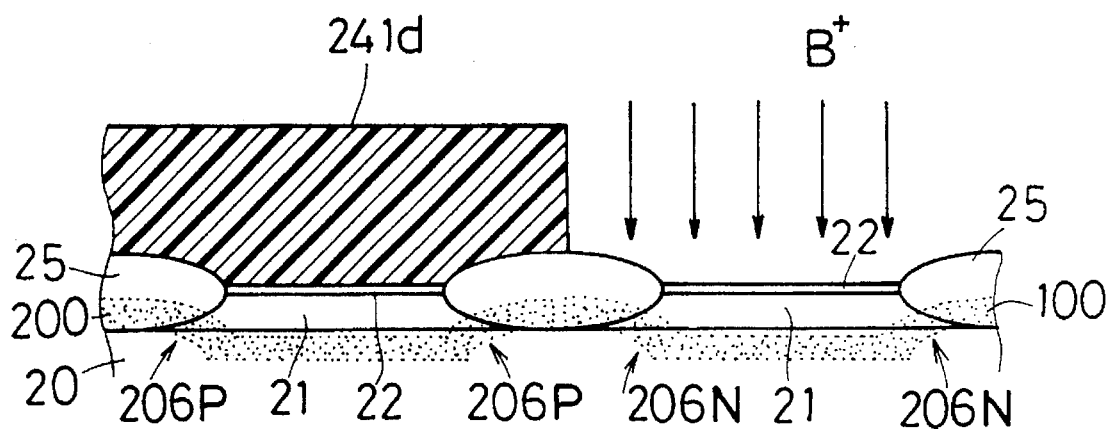
Figure 36:
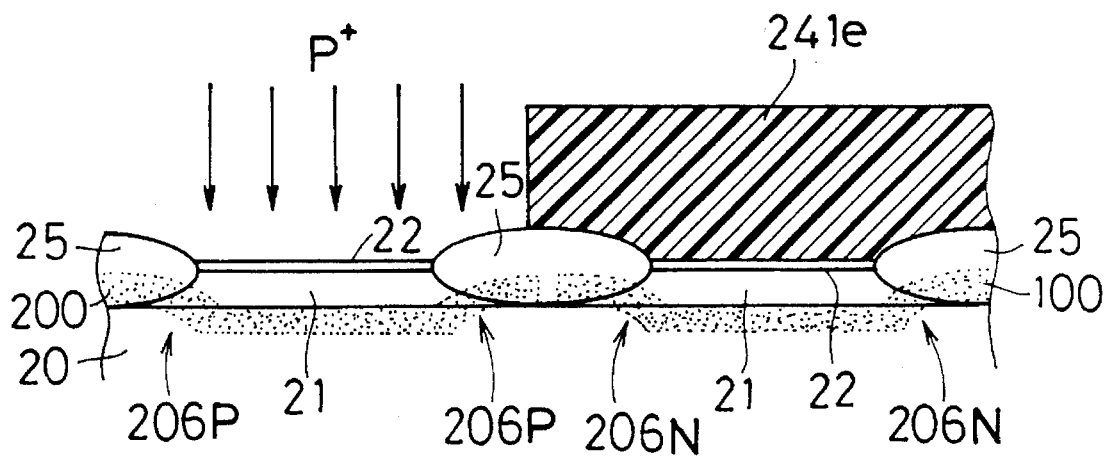

Afterwards, forming a resist 241d in the PMOS region, boron ions are implanted in the NMOS region by $3\times10^{12}/cm^2$ with an energy of 20 keV (FIG. 35). This implantation is for channel doping, and for setting the threshold voltage of the NMOS transistor. After boron ion implantation, the resists 241d is removed. Forming a resist 241e in the NMOS region, phosphorus ions are implanted in the PMOS region by $3\times10^{11}/cm^2$ with an energy of 20 keV. This implantation is for setting the threshold voltage of the PMOS transistor.

According to the manufacturing method in the second preferred embodiment, in ion implantation for channel cutting implantation, double coating of resist is not required as in the prior art, and hence channel cutting implantation can be applied in either PMOS region or NMOS region.

Figure 37:
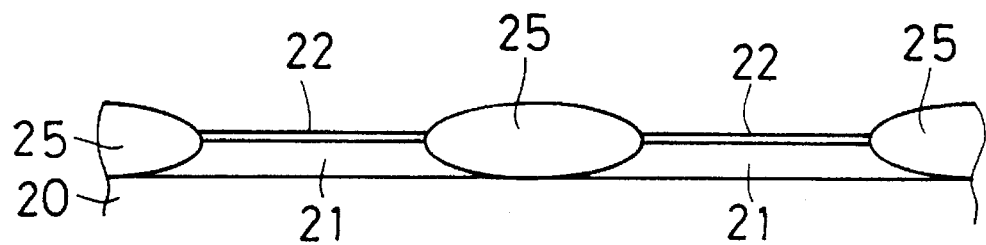
Figure 38:
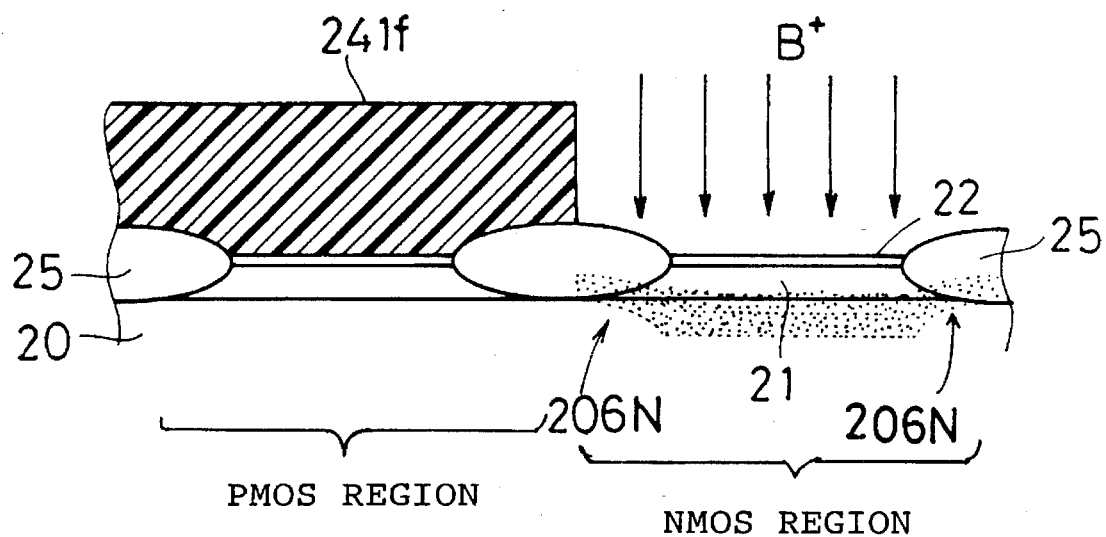

After the step of forming the oxide film 25 as shown in FIG. 37, a resist 241f is formed only in the PMOS region as shown in FIG. 38, and ion implantation for channel cutting is applied, and at this time when the implantation energy is about 32 keV, the ion implantation for channel cutting also serves as ion implantation for channel doping, so that the process is simplified.

Figure 39:
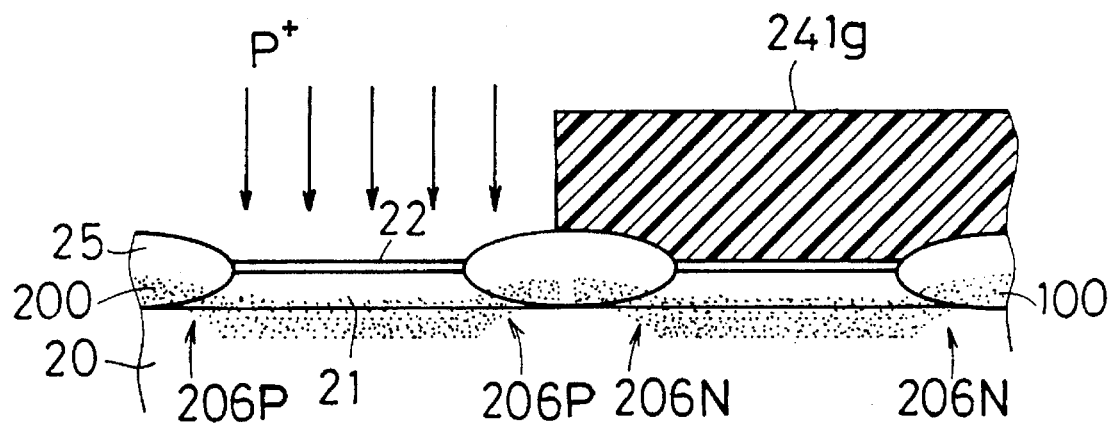

Moreover, as shown in FIG. 39, forming a resist 241g only in the NMOS region, ion implantation for channel cutting serves also as ion implantation for channel doping, so that the process is also simplified. In this case, additional step of photolithography process is not required for ion implantation.

Third Preferred Embodiment

Figure 40:
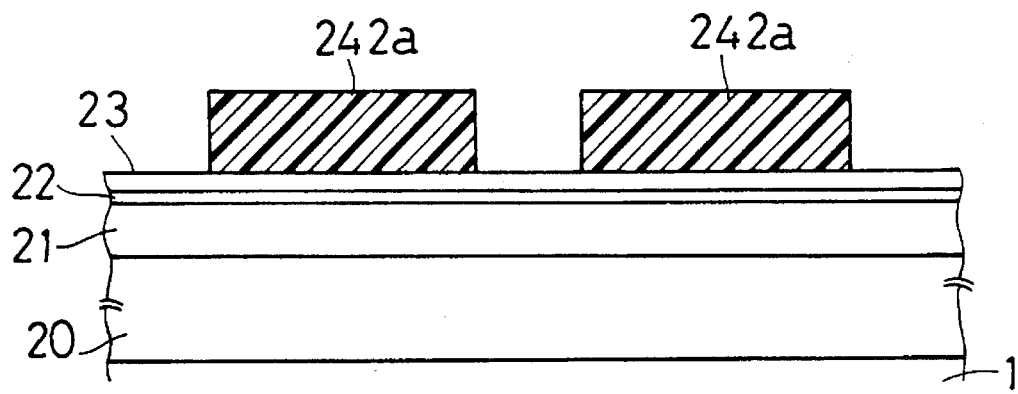
FIGS. 40 to 43 are sectional views for explaining a third preferred embodiment in a process sequence.

FIG. 40 to FIG. 43 are sectional views showing a third preferred embodiment of the invention in the sequence of steps. First, on a semiconductor layer 1, an insulating film 20 is formed, and a semiconductor layer 21 thereon. The semiconductor layer 21 is oxidized, and an oxide film 22 is formed in a thickness of 100 angstroms. Further on the oxide film 22, a nitride film 23 is formed in a thickness of 100 angstroms, and a resist 242a is patterned in a shape of field for forming a transistor (FIG. 40). Using the resist 242a as mask, the nitride film 23 is removed selectively by dry etching.

Figure 41:
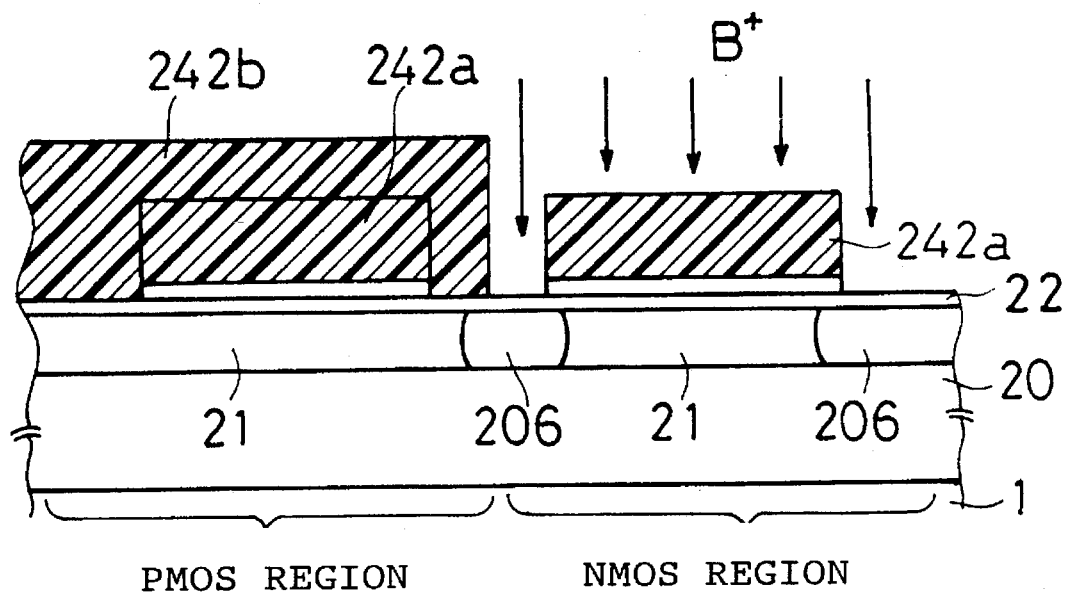

By patterning (double coating) a resist 242b only in the PMOS region, boron ions are implanted in the NMOS region at an implantation angle of about 7° by $3\times10^{13}/cm^2$ with an energy of 20 keV. As a result, a high concentration impurity region 206 is formed in the end portion of the NMOS region (FIG. 41).

Figure 42:
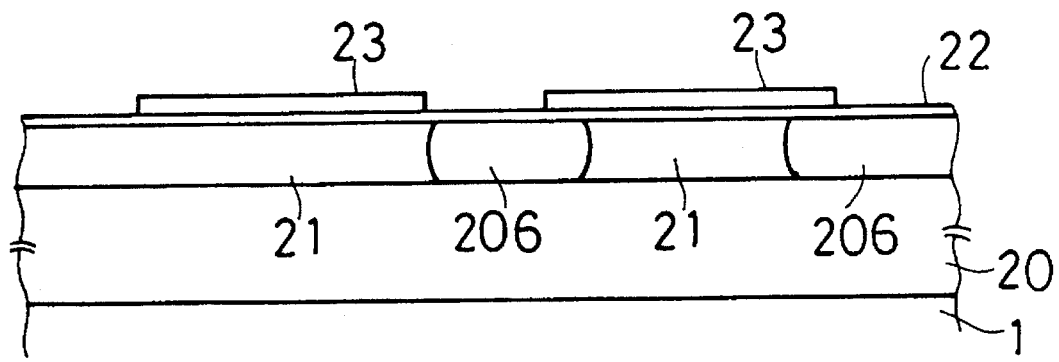

After removing the resists 242a, 242b, heat treatment (drive) is applied in the condition of 950° C. and 30 to 90 minutes (for example, 60 minutes). As a result, implanted boron ions diffuse into the semiconductor layer 21 which forms a channel layer (FIG. 42). The concentration is about $1\times10^{18}/cm^3$.

Figure 43:
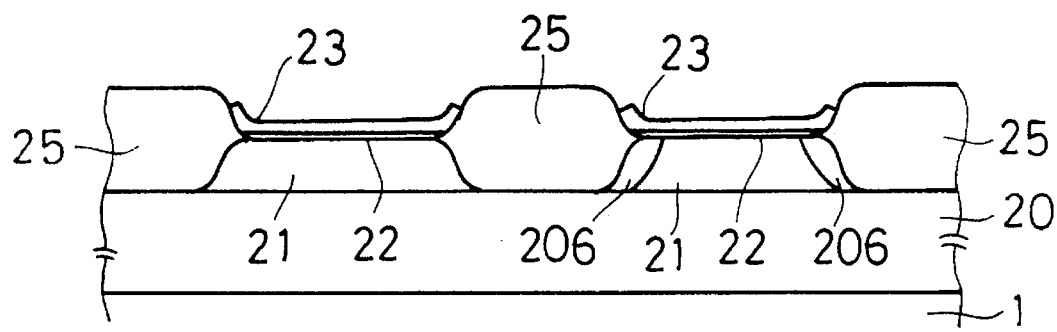

Using the nitride film 23 as mask, an oxide film 25 is formed by LOCOS oxidation of semiconductor layer 21 at 950° C. and in a wet atmosphere (FIG. 43). By the drive in the step before LOCOS oxidation, the high concentration impurity region 206 of boron ions has already diffused widely more than the forming region of the oxide film 25. Hence, if the oxide film 25 absorbs boron by LOCOS oxidation, lowering of impurity concentration of the semiconductor layer 21 near the oxide film 25 can be suppressed. Therefore, generation of parasitic transistor near the oxide film 25 can be suppressed.

The subsequent steps may be same as shown in the first preferred embodiment. The drive before LOCOS oxidation is expected to be effective similarly if treated at 850° C. or higher.

Fourth Preferred Embodiment

Figure 44:
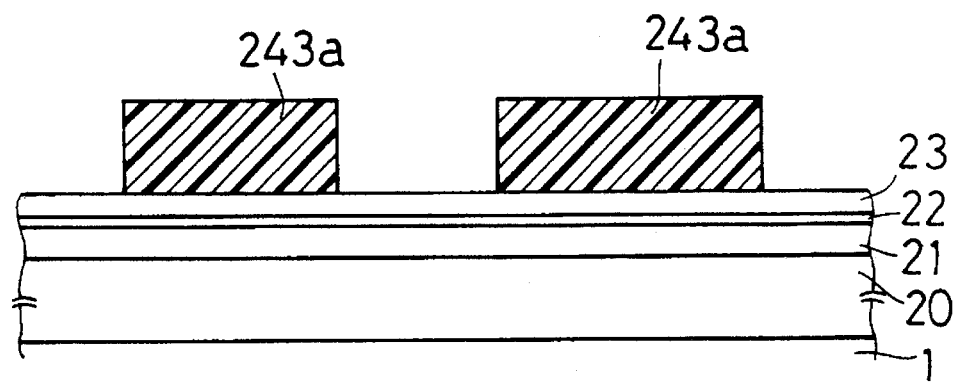
FIGS. 44 to 47 are sectional views for explaining a fourth preferred embodiment in a process sequence.
a process sequence.

FIG. 44 to FIG. 47 are sectional views of a fourth preferred embodiment of the invention shown in the sequence of steps. First, on a semiconductor layer 1, an insulating film 20 is formed, and a semiconductor layer 21 thereon. The semiconductor layer 21 is oxidized, and an oxide film 22 is formed in a thickness of 300 angstroms. Further on the oxide film 22, a nitride film 23 is formed in a thickness of 500 angstroms, and a resist 243a is patterned in a shape of field for forming a transistor (FIG. 44). Using the resist 243a as mask, the nitride film 23 is removed selectively by dry etching.

Figure 45:
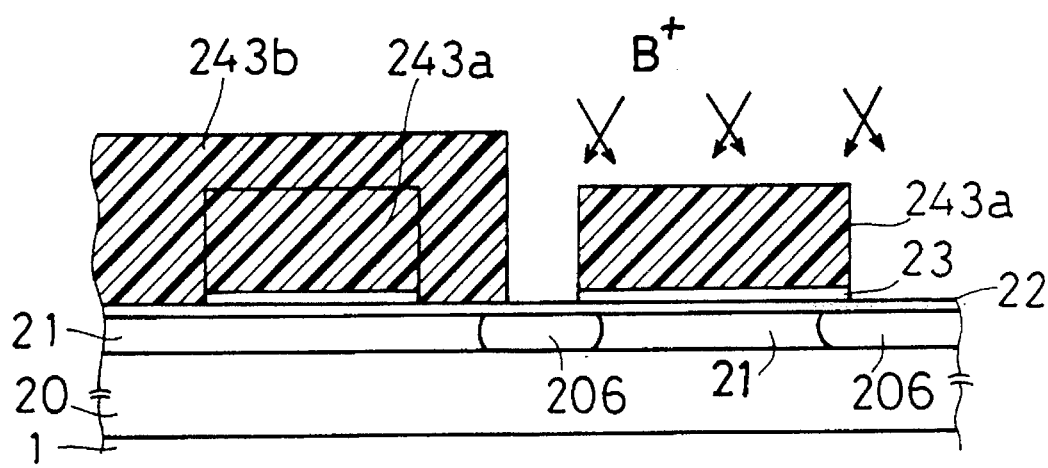

By patterning a resist 243b only in the PMOS region, boron ions are implanted in the NMOS region at an implantation angle of 30° to 60° by $3\times10^{13}$ to $2\times10^{14}/cm^2$ with an energy of 20 to 30 keV by rotating continuously. As a result, a high concentration impurity region 206 is formed in the end portion of the NMOS region (FIG. 45). By thus implanting boron ions obliquely at an angle, as compared with the ordinary implantation angle (up to 7°), the high concentration impurity region 206 of boron ions can be widened by about 0.1 μm. Hence, a high concentration impurity region 206 of boron ions is also formed at the end of the semiconductor layer 21 as the channel region of the NMOS transistor, that is, near the oxide film 25. The impurity concentration in this area is about $1\times10^{18}/cm^3$.

Figure 46:
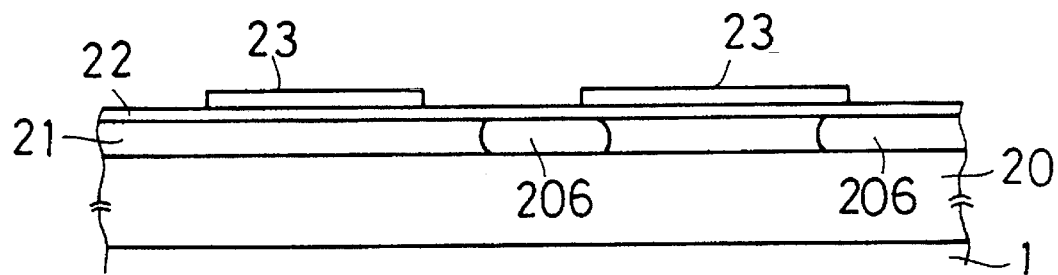
Figure 47:
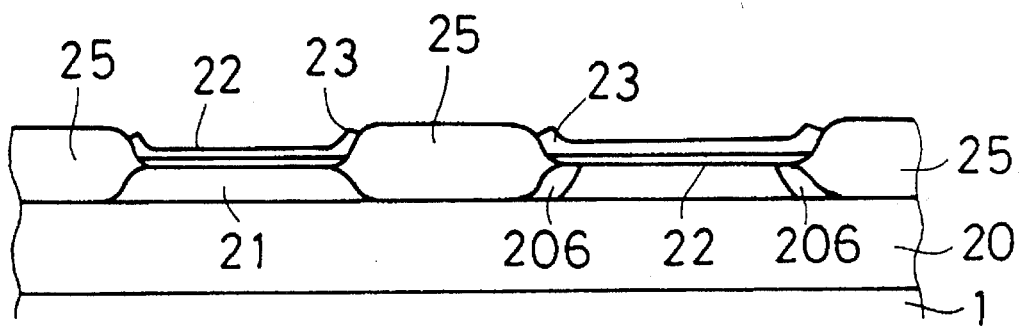

Afterwards, as shown in FIG. 46, the resists 243a, 243b are removed. Using the nitride film 23 as mask, an oxide film 25 is formed by LOCOS oxidation of semiconductor layer 21 at 950° C. and in a wet atmosphere (FIG. 47). The high concentration impurity region 206 is previously formed widely more than the forming region of the oxide film 25. Hence, if the oxide film 25 absorbs boron by LOCOS oxidation, lowering of impurity concentration of the semiconductor layer 21 to cause parasitic transistor can be avoided.

The subsequent processes may be same as shown in the first preferred embodiment.

Fifth Preferred Embodiment

FIG. 48 to FIG. 51 are sectional views of a fifth preferred embodiment of the invention shown in the sequence of steps.

Figure 48:
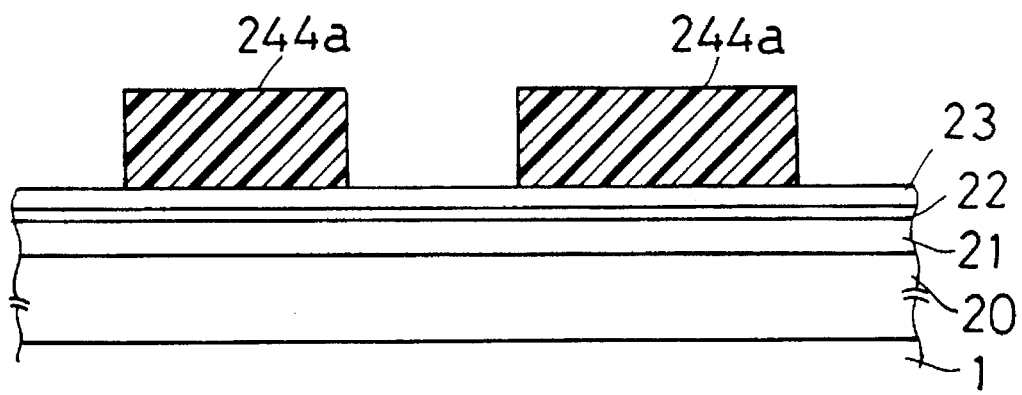
FIGS. 48 to 51 are sectional views for explaining a fifth preferred embodiment in a process sequence.

First, on a semiconductor layer 1, an insulating film 20 is formed, and a semiconductor layer 21 thereon. The semiconductor layer 21 is oxidized, and an oxide film 22 is formed in a thickness of 100 angstroms. Further on the oxide film 22, a nitride film 23 is formed in a thickness of 500 angstroms, and a resist 244a is patterned in a shape of field for forming a transistor (FIG. 48). Using the resist 244a as mask, the nitride film 23 is removed selectively by dry etching.

Figure 49:
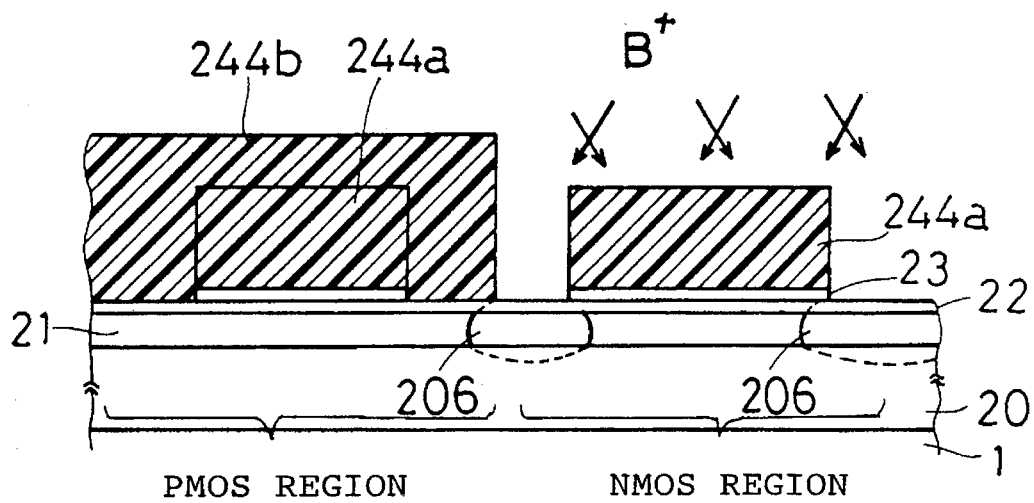

By patterning a resist 244b only in the PMOS region, boron ions are implanted in the NMOS region at an implantation angle of 20° to 60° to $8\times10^{13}$ to $2\times10^{14}/cm^2$ with an energy of 20 to 30 keV by rotating continuously. As a result, a high concentration impurity region 206 is formed in the end portion of the NMOS region (FIG. 49). By thus implanting boron ions obliquely at an angle, as compared with the ordinary implantation angle (up to 7°), the high concentration impurity region 206 of boron ions can be widened by about 0.1 μm. So far the process is similar to the fourth preferred embodiment.

Figure 50:
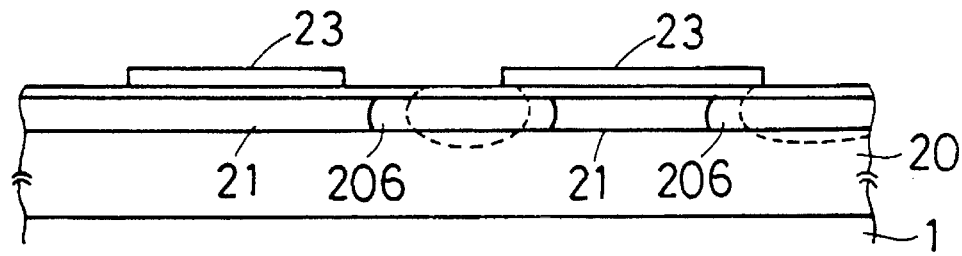
Figure 51:
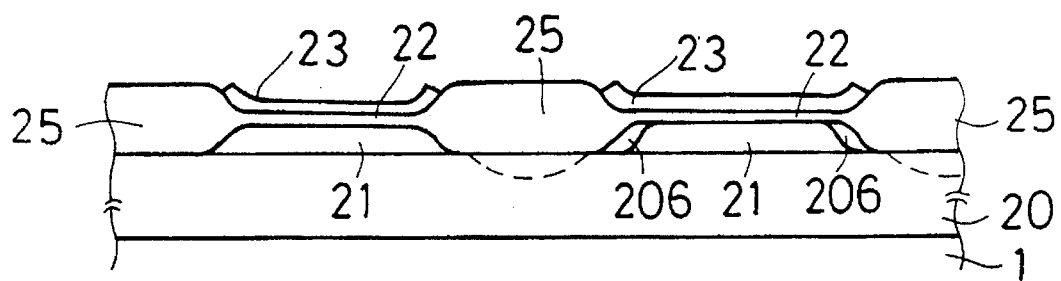
Figure 52:
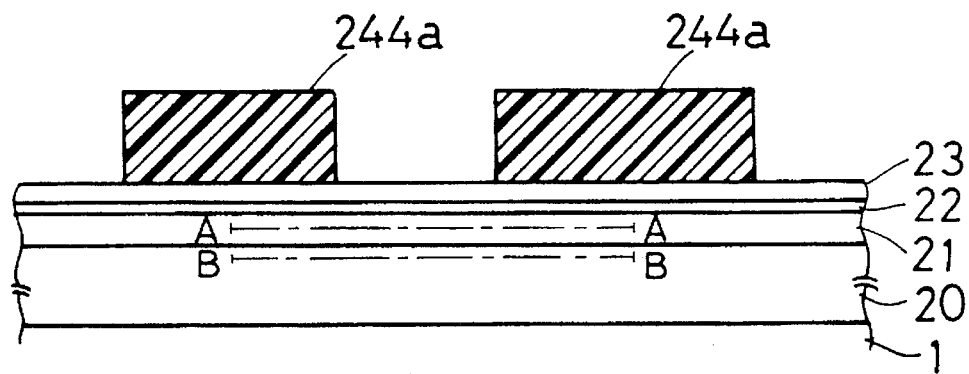
FIGS. 52 to 55 are sectional views for explaining an impurity profile in the fifth preferred embodiment.
Figure 53:
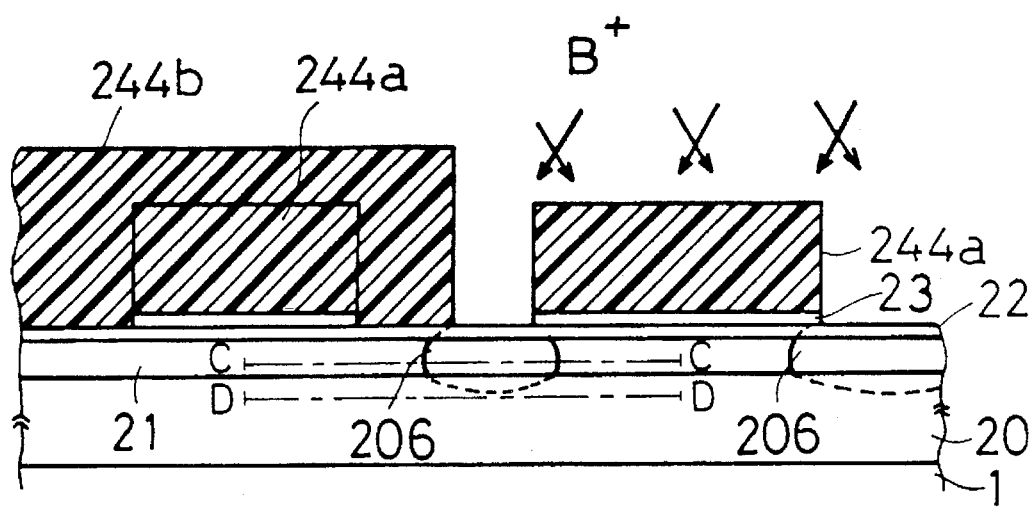
Figure 54:
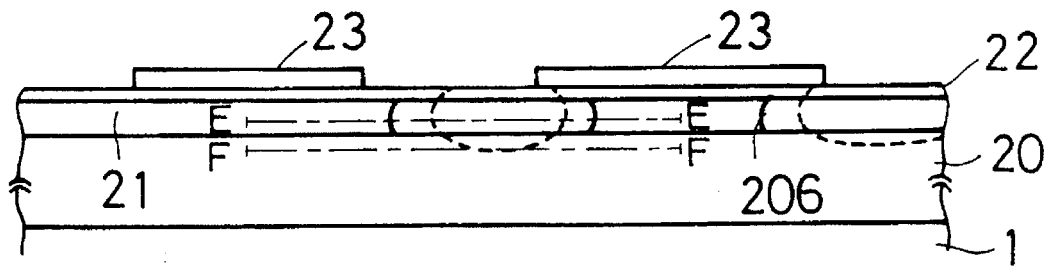
Figure 55:
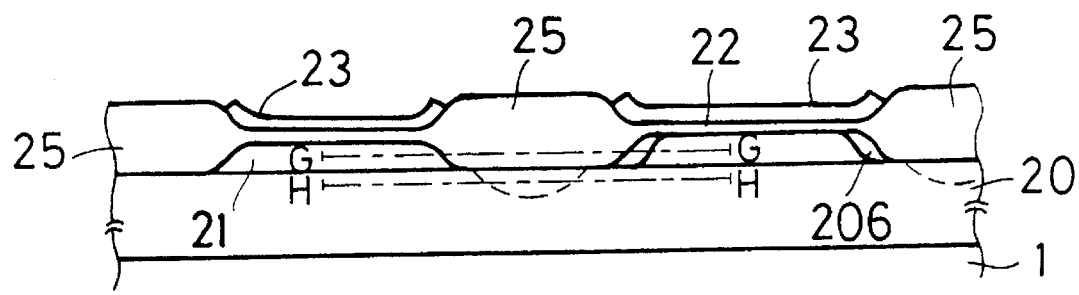

Then, similarly to the third preferred embodiment, the resists 244a, 244b are removed, and heat treatment (drive) is applied at 950° to 1000° C. for 60 minutes. By this drive, the shape of the high concentration impurity region 206 is diffused from the broken line to the solid lie (FIG. 50). The impurity concentration in the high concentration impurity region 206 is about $1\times10^{18}/cm^3$.

Using the nitride film 23 as mask, the semiconductor layer 21 is oxidized by LOCOS process in a wet atmosphere in the same manner as in the fourth preferred embodiment. In this step of LOCOS oxidation, if boron ions are sucked into the oxide film 25, since the high concentration impurity region 206 has been already formed, the impurity concentration of the semiconductor layer 21 near the oxide film 25 can be maintained to a certain extent. The subsequent CMOS forming process is same as the process shown in the first preferred embodiment.

Figure 56:
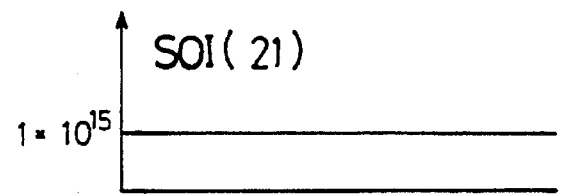
FIGS. 56(A)–56(H) are the graphs showing an impurity profile in the fifth preferred embodiment.
Figure 56:
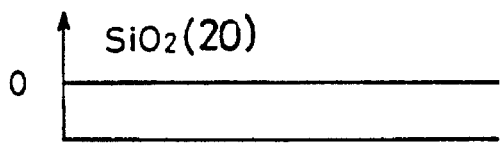
Figure 56:
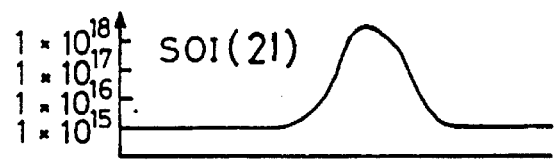
Figure 56:
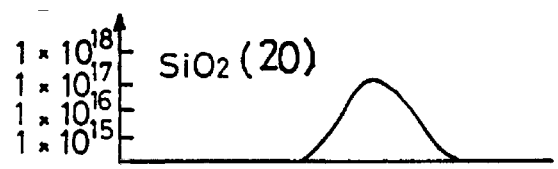
Figure 56:
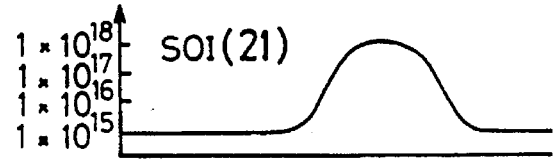
Figure 56:
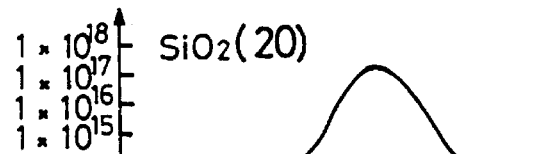
Figure 56:
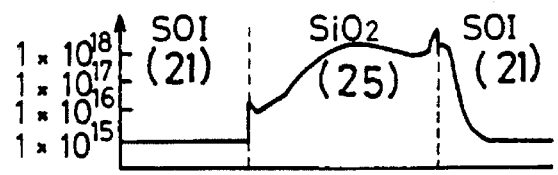
Figure 56:
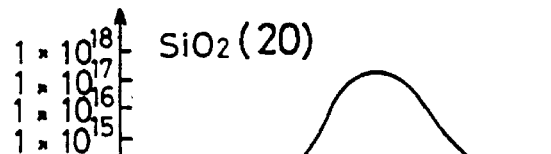

The profile of concentration of boron ions obtained in the above process is investigated in each step below. FIG. 52 to FIG. 55 are reproductions of sectional views shown in FIG. 44 to FIG. 51, showing positions of parts A to H. FIG. 56 is a graph showing the profile in each step of the concentration distribution of boron ions in the lateral direction at positions of parts A to H. In the diagrams, SOI denotes the semiconductor layer 21, and $SiO_2$ refers to the insulating layer 20 or oxide film 25. As known from the profile of impurity concentration at position G in FIG. 56, the impurity concentration of the semiconductor layer 21 near the oxide film 25 in the NMOS region is sufficiently heightened. Therefore, generation of parasitic transistor can be suppressed.

Sixth Preferred Embodiment

Figure 57:
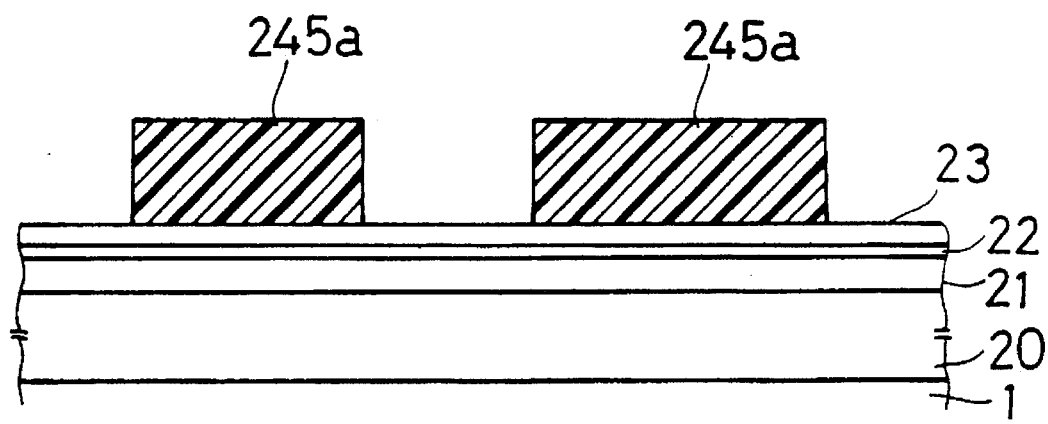
FIGS. 57 to 60 are sectional views for explaining a sixth preferred embodiment in a process sequence.
Figure 58:
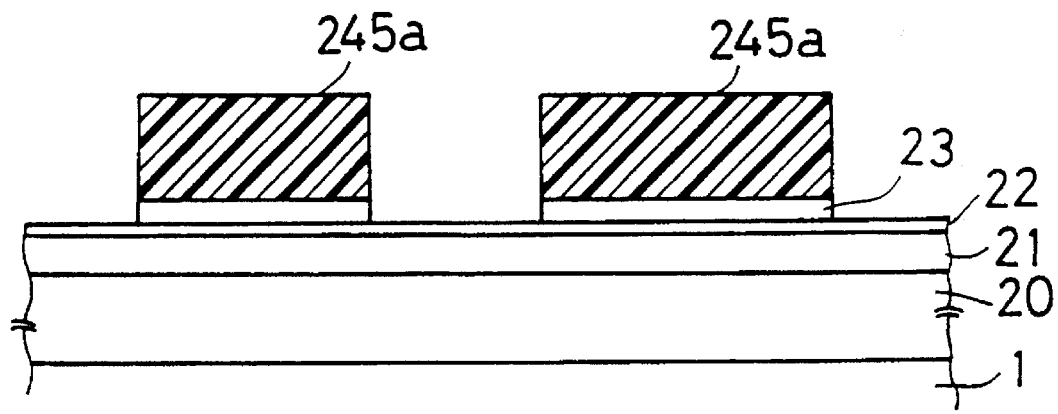

FIG. 57 to FIG. 60 are sectional views of a sixth preferred embodiment of the invention shown in the sequence of steps. Same as in the fifth preferred embodiment, on a semiconductor layer 1, an insulating film 20, a semiconductor layer 21, and an oxide film 22 in a film thickness of 100 angstroms are formed. Further on the oxide film 22, a nitride film 23 is formed in a thickness of 1000 angstroms, and a resist 245a is patterned in a shape of field for forming a transistor (FIG. 57). Using the resist 245a as mask, the nitride film 23 is removed selectively by dry etching (FIG. 58).

Figure 59:
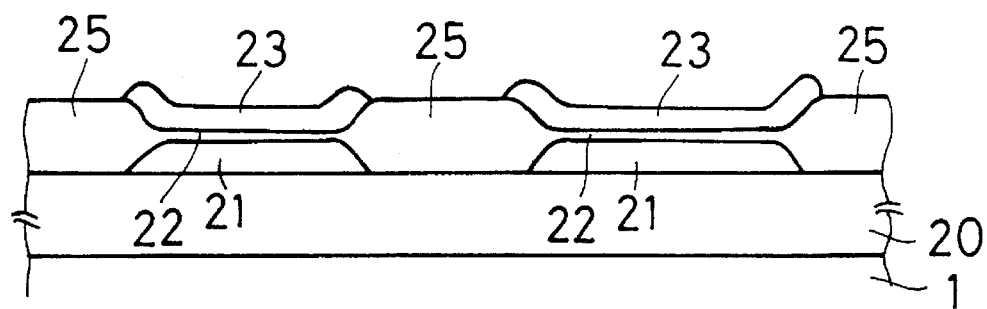

Removing the resist 245a, and using the nitride film 23 as mask, the semiconductor layer 21 is oxidized by LOCOS process in a wet atmosphere at 950° C. (FIG. 59). In this LOCOS oxidation, usually, a stress is applied on the interface of the oxide film 25 and semiconductor layer 21, and fine defects are formed in the semiconductor layer 21. These defects also cause to form parasitic transistor.

To prevent effect of parasitic transistor, it may be considered to set the threshold voltage of the parasitic transistor around the semiconductor layer 21 higher than the original threshold voltage of the channel. That is, the threshold voltage near the oxide film 25 may be compensated by only the thickness of oxide film, but actually it is often difficult.

Figure 60:
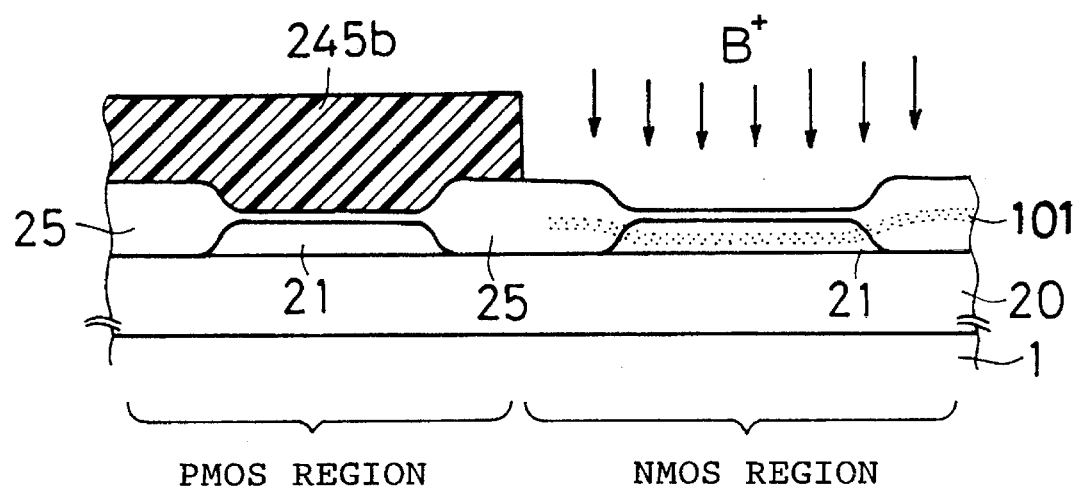

As shown in FIG. 60, by patterning a resist 245b only in the PMOS region, boron ions for channel doping are implanted in the NMOS region at an implantation angle of about 7° by $1 \times 10^{12}$ to $7 \times 10^{12}/cm^2$ with an energy of 20 keV. The peak 101 of the impurity concentration reflects the surface shape of the wafer to be implanted. Hence, the impurity concentration of the semiconductor layer 21 near the oxide film 25 is lower than that of the semiconductor layer 21 positioned sufficiently remote from the oxide film 25.

Afterwards, a sufficient heat treatment is applied until the impurity in the semiconductor layer 21 becomes uniform in profile. For example, heat treatment is done for 60 minutes at 950° to 1050° C. Or the heat treatment may be done after implanting an impurity in the PMOS region.

By this heat treatment, the semiconductor layer 21 near the oxide film 25 recovers from the defects. Hence, without generation of parasitic transistor, it eliminates necessity of implantation (channel cut implantation) for preventing worsening of device characteristics due to defects by impurity implantation of high concentration as shown in the conventional manufacturing method of semiconductor. Hence, double coating when forming resist is not required, and the process is simplified.

The manufacturing process after the gate wiring forming step is same as the process shown in the first preferred embodiment.

Seventh Preferred Embodiment

Figure 61:
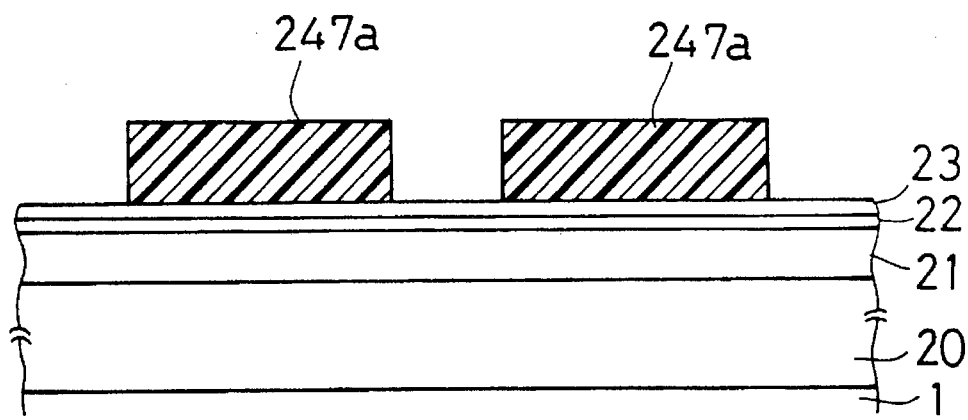
FIGS. 61 to 65 are sectional views for explaining a seventh preferred embodiment in a process sequence.

FIG. 61 to FIG. 65 are sectional views of a seventh preferred embodiment of the invention shown in the sequence of steps. Same as in the fifth preferred embodiment, on a semiconductor layer 1, an insulating film 20, a semiconductor layer 21, an oxide film 22 in a film thickness of 100 angstroms, and a nitride film 23 in a thickness of 500 angstroms are formed. Further a resist 247a is patterned in a shape of field for forming a transistor (FIG. 61). Using the resist 247a as mask, the nitride film 23 is removed selectively by dry etching.

Figure 62:
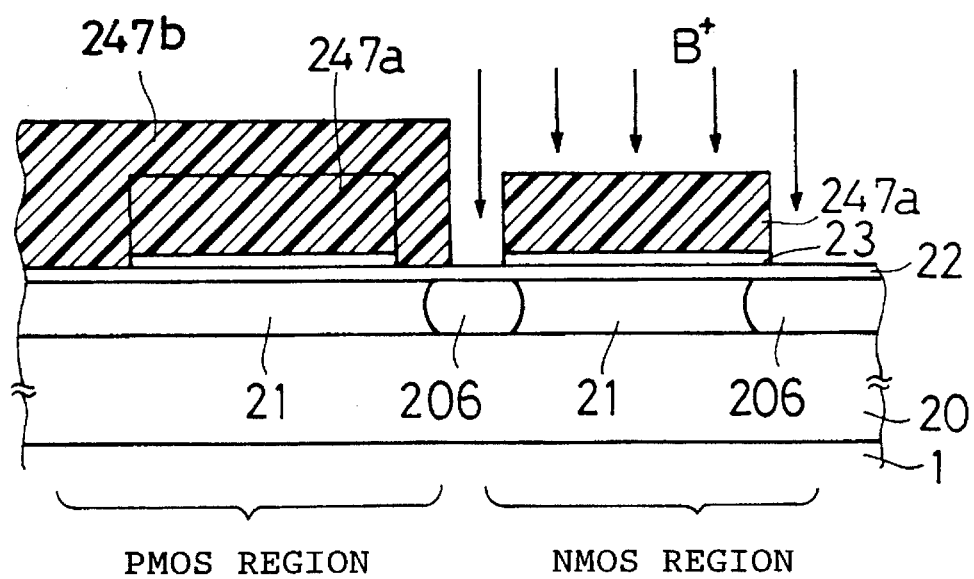
Figure 63:
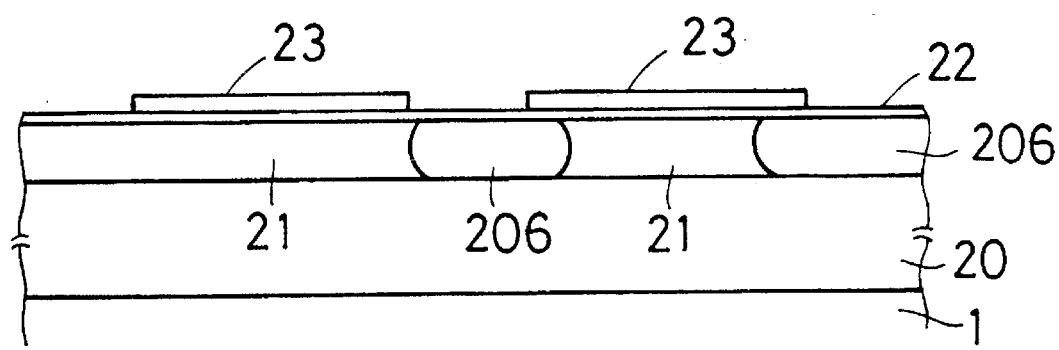

Then, patterning (double coating) a resist 247b only in the PMOS region, boron ions are implanted in the NMOS region at an implantation angle of about 7° by $8 \times 10^{13}/cm^2$ with an energy of 20 keV (FIG. 62). As a result, a high concentration impurity region 206 is formed.

Figure 64:
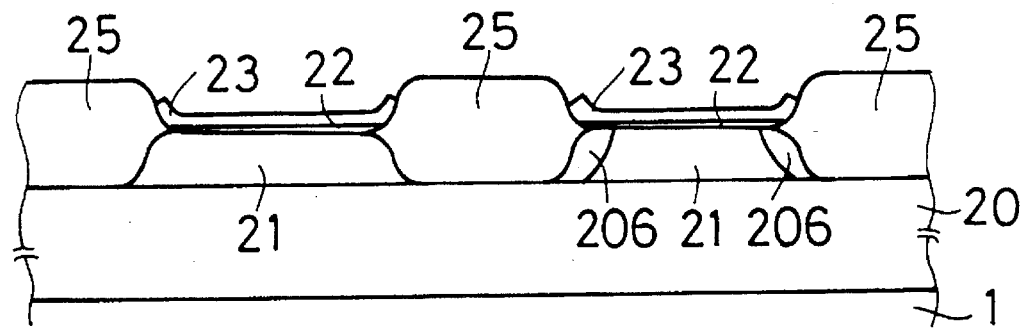

After removing the resists 247a, 247b (FIG. 63), drive is applied in the condition of 950° C. and 60 minutes. Consequently, the high concentration impurity region 206 is expanded into the semiconductor layer 21 as the channel layer, while the semiconductor layer 21 not covered with nitride film 23 is oxidized by LOCOS process, and oxide film 25 is formed (FIG. 64).

Figure 65:
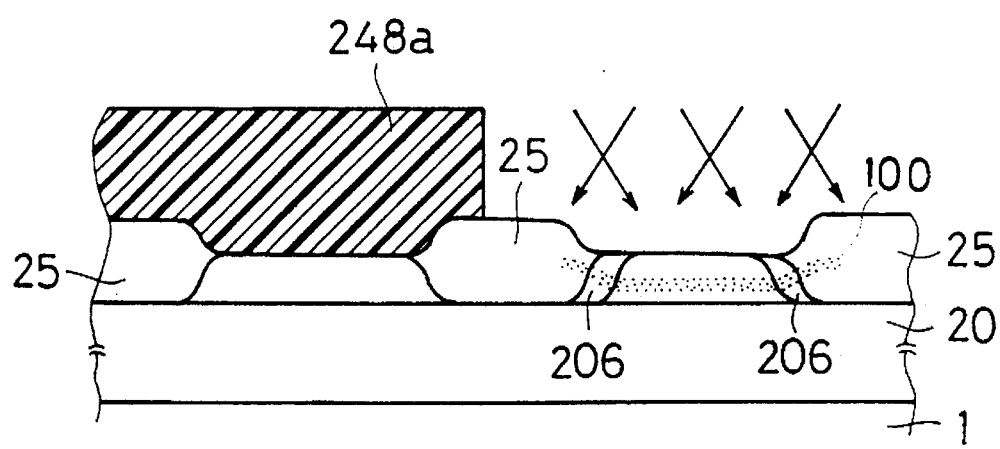
Figure 66:
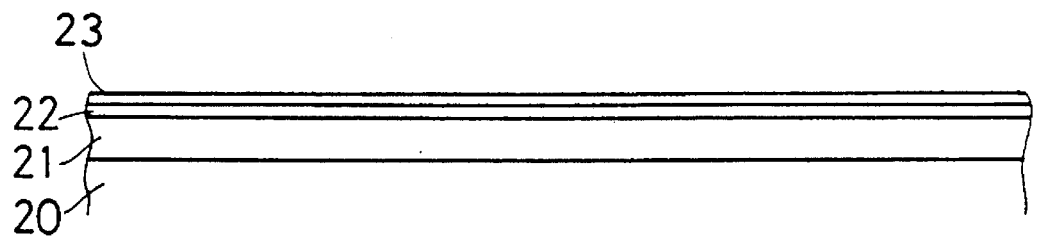
FIGS. 66 to 90 are sectional views for explaining the conventional manufacturing method of semiconductor device in a process sequence.
Figure 67:
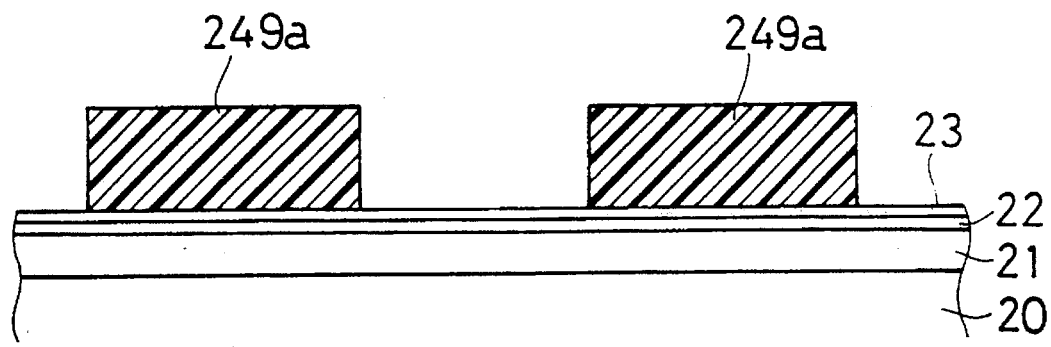
Figure 68:
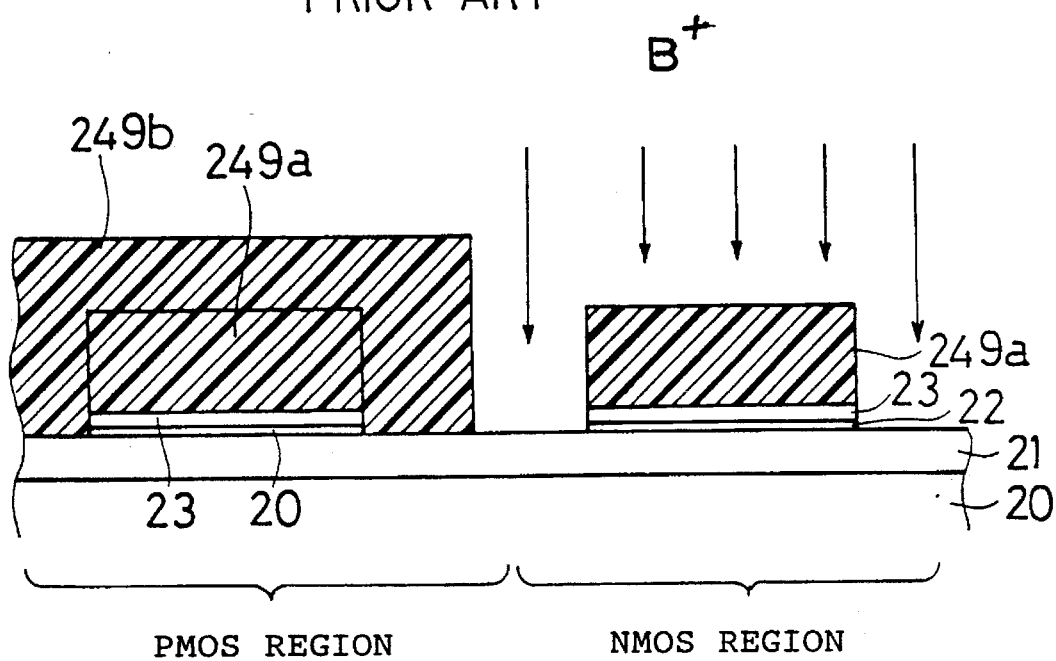
Figure 69:
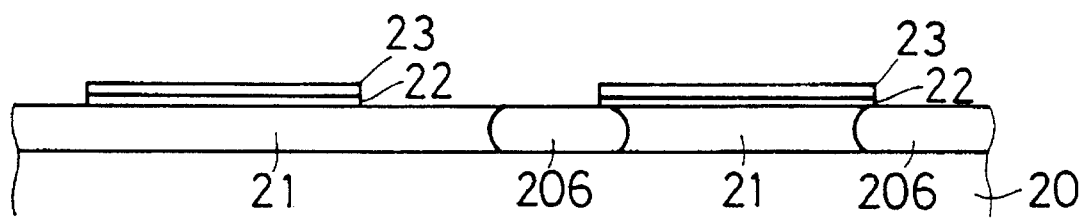
Figure 70:
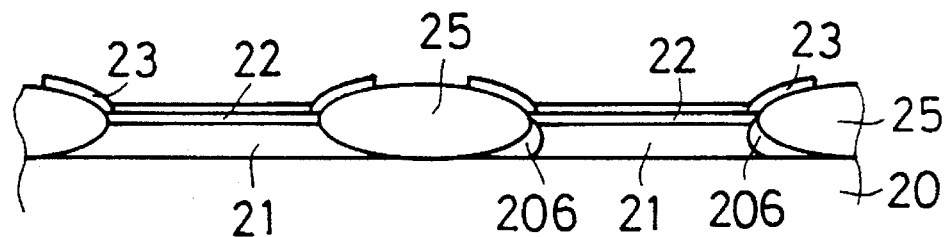
Figure 71:
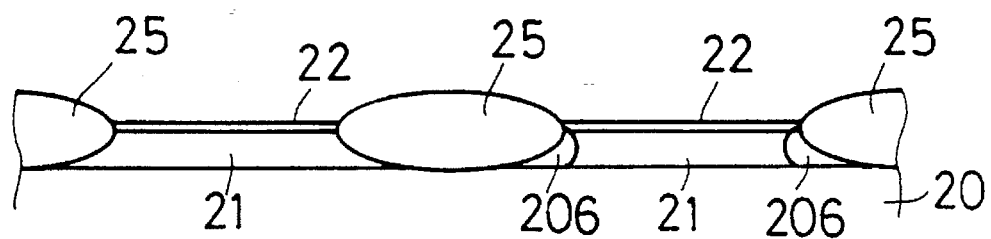
Figure 72:
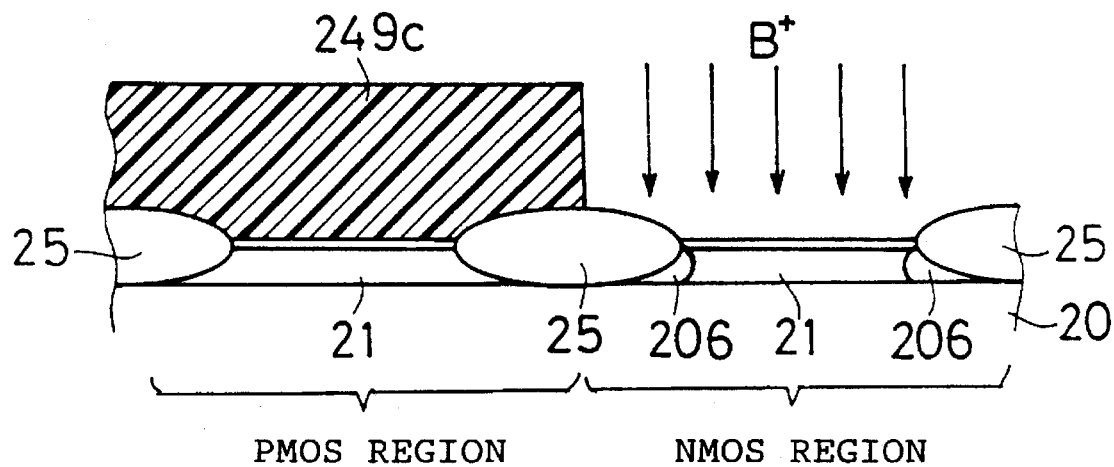
Figure 73:
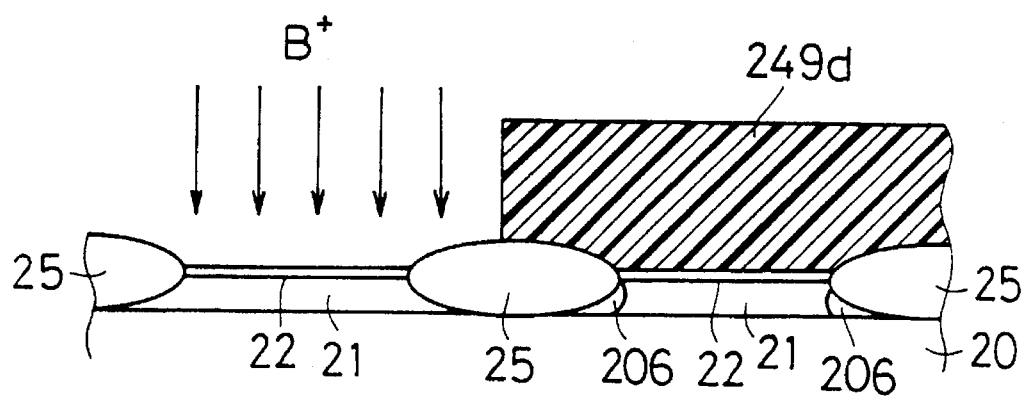
Figure 74:
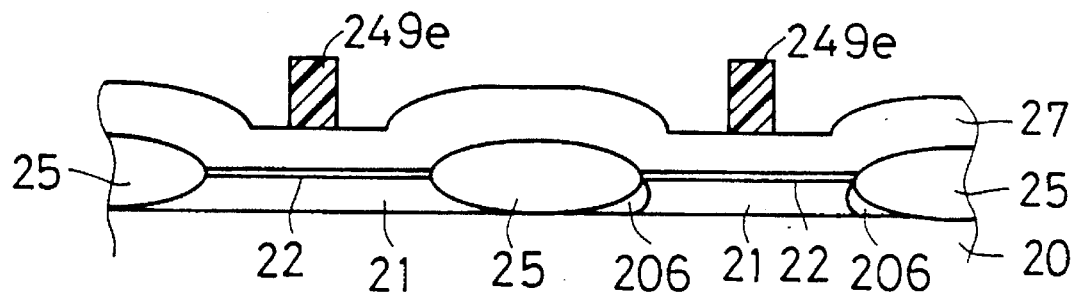
Figure 75:
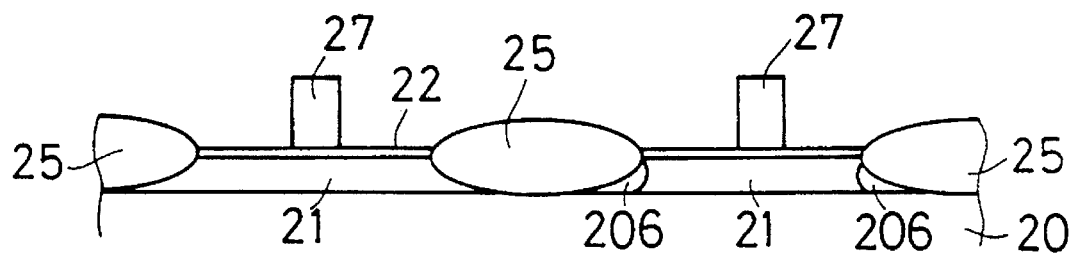
Figure 76:
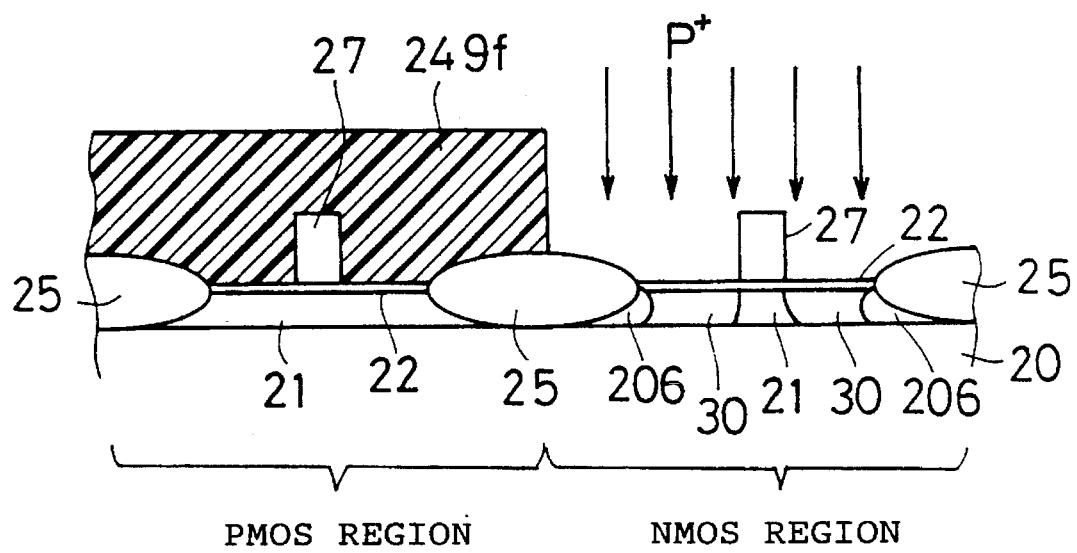
Figure 77:
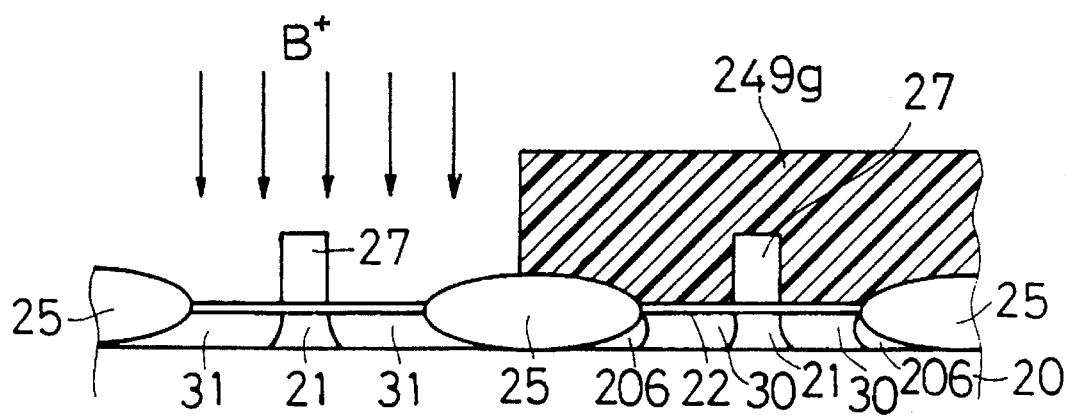
Figure 78:
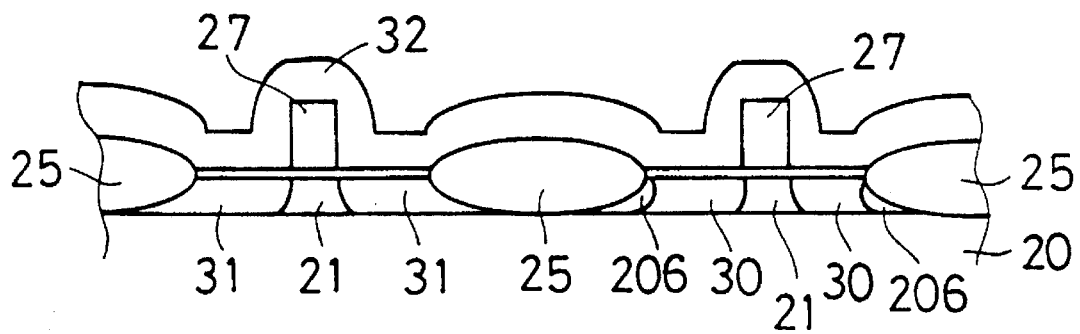
Figure 79:
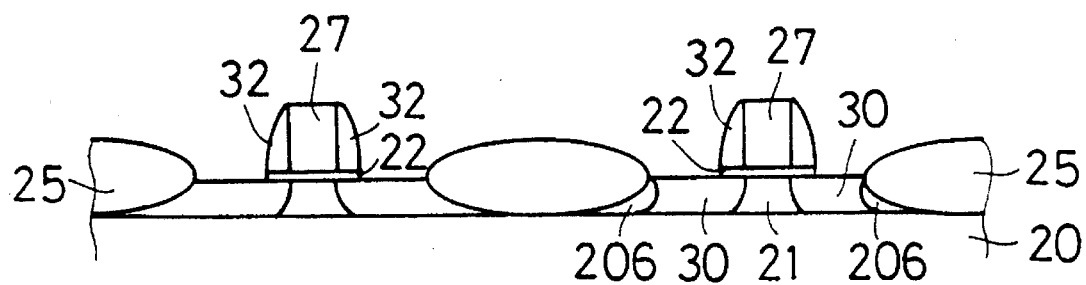
Figure 80:
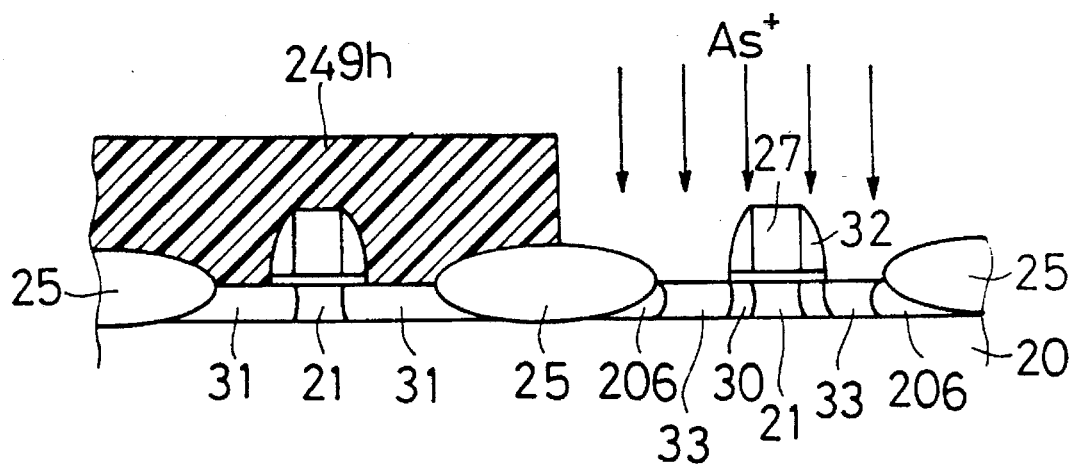
Figure 81:
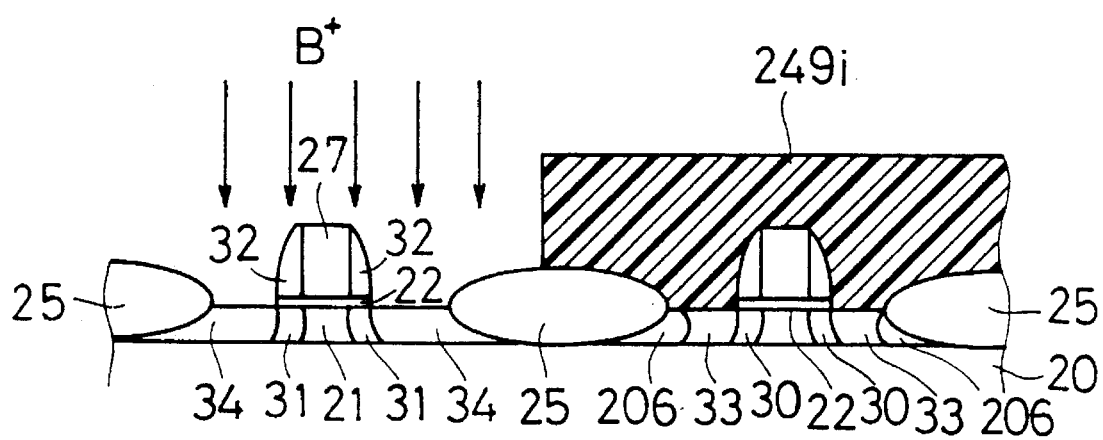
Figure 82:
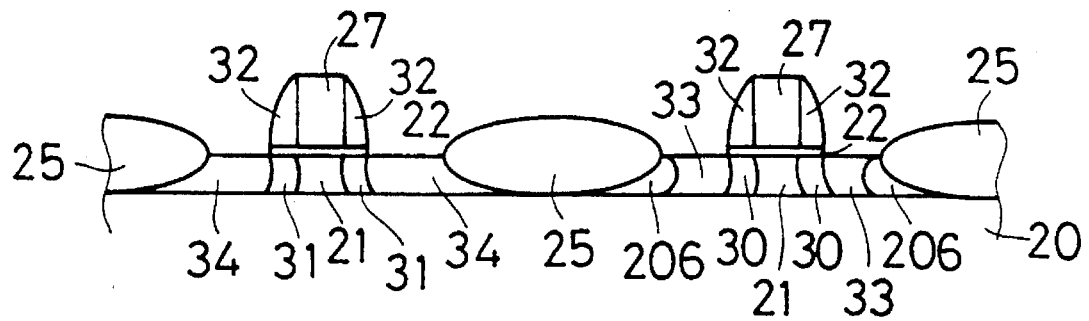
Figure 83:
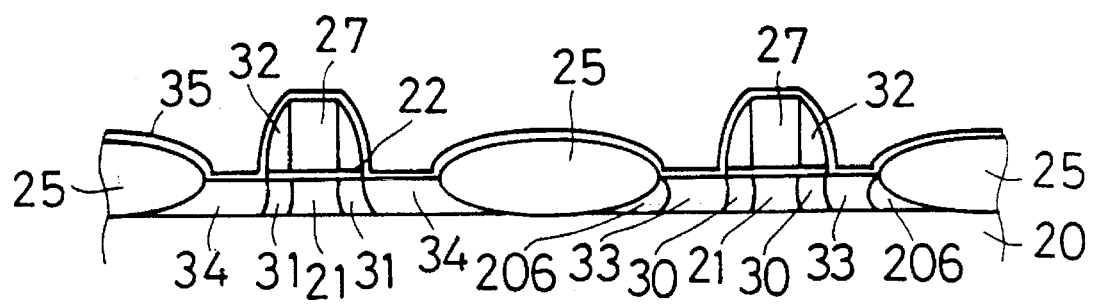
Figure 84:
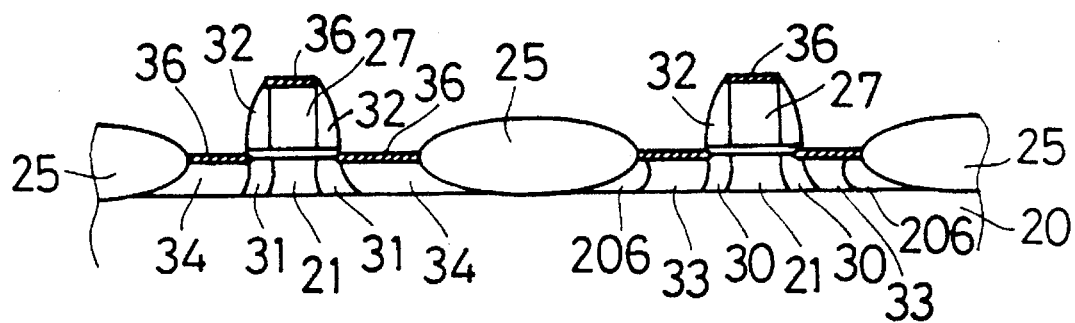
Figure 85:
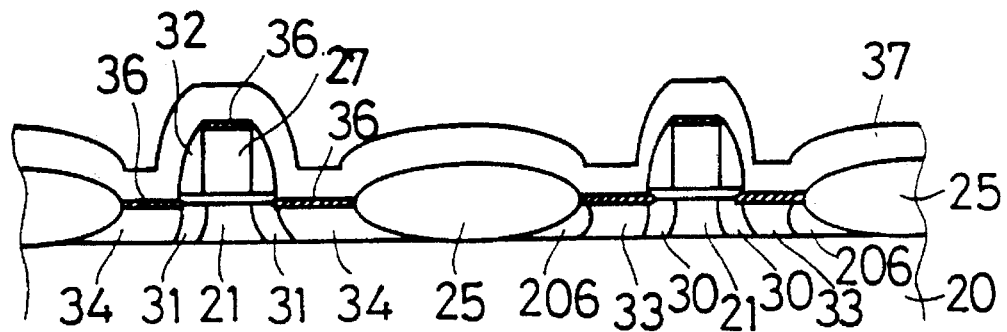
Figure 86:
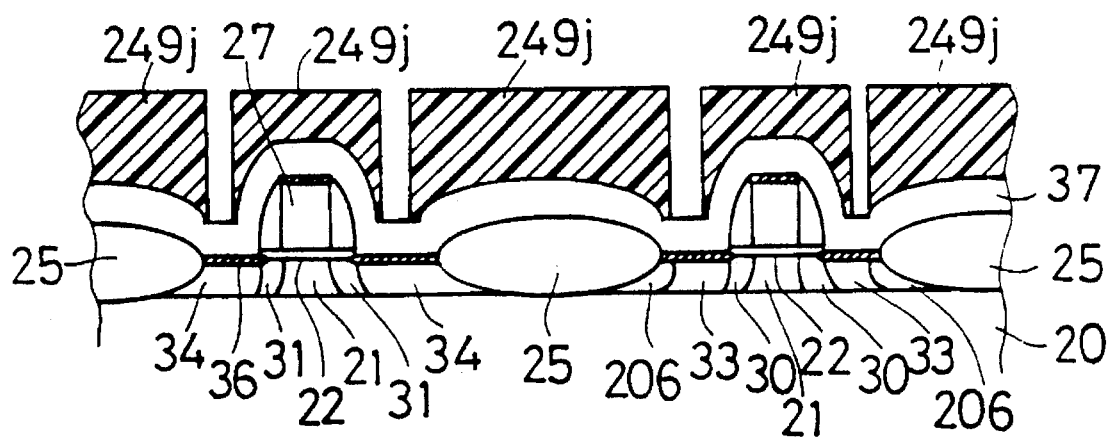
Figure 87:
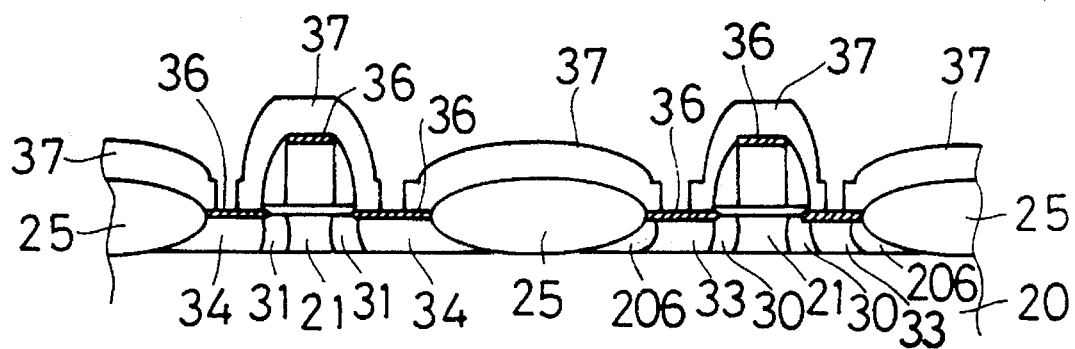
Figure 88:
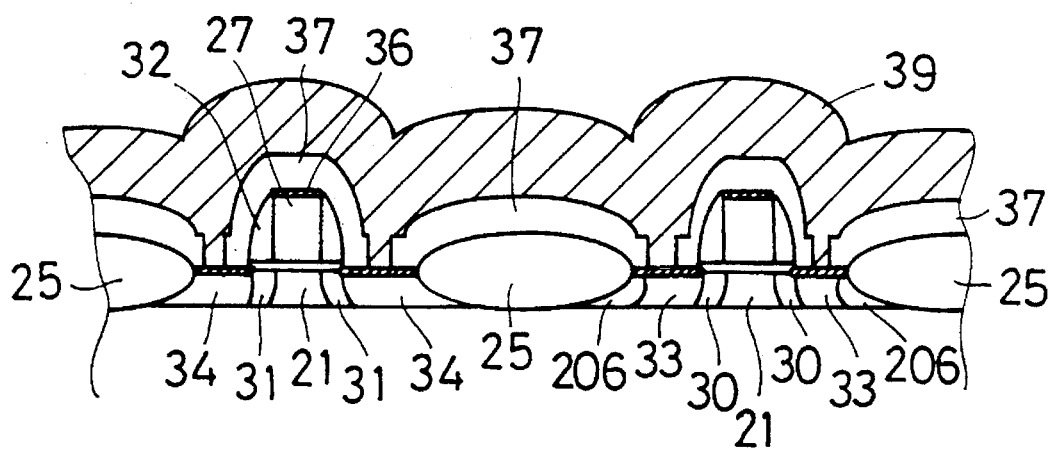
Figure 89:
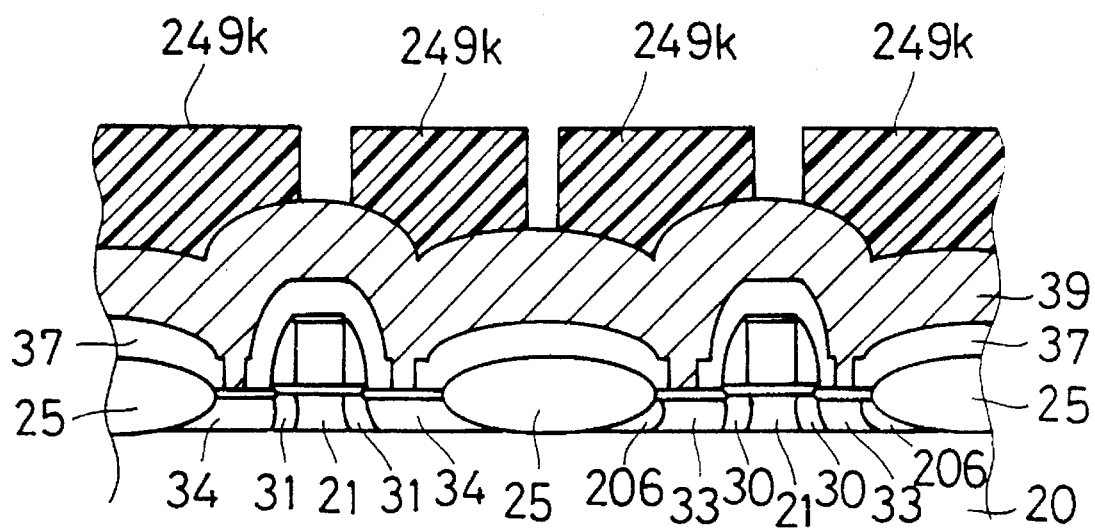
Figure 90:
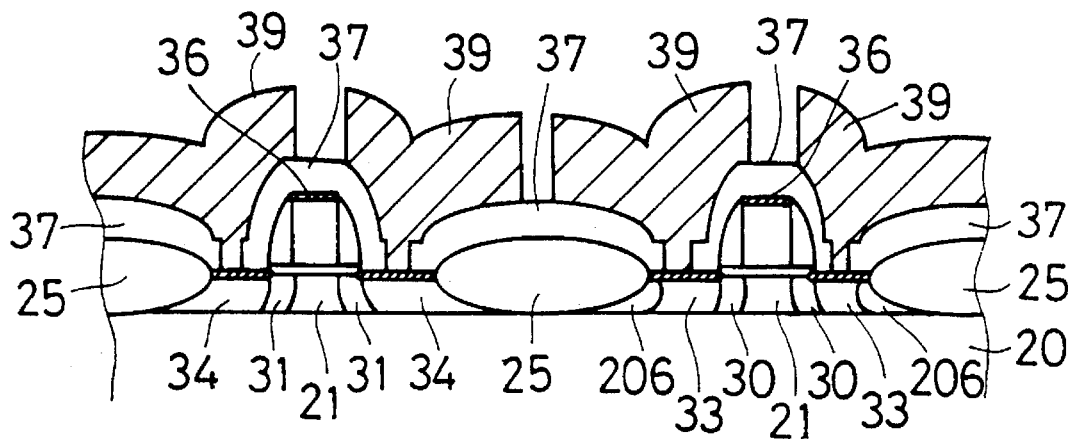

Removing the nitride film 23, channel ions are implanted for setting the threshold voltage. For this channel ion implantation, boron ions are implanted by rotary oblique injection at implantation angle of 45° to 60° by $4 \times 10^{12}/cm^2$ with an energy of 20 to 30 keV. The peak position 100 is as shown in FIG. 65.

By employing the rotary oblique injection for this channel ion implantation, the impurity concentration of the semiconductor layer 21 near the oxide film 25, that is, the high concentration impurity region 206 can be further heightened. As mentioned above, the parasitic transistor is formed in the region of low concentration and the electric field concentrating region due to shape of the semiconductor layer 21, and therefore it is the edge of the oxide film 25 and the surface region of the semiconductor layer 21. Since the rotary injection of channel implantation further heightens the concentration in this region, it is more effective for suppressing generation of parasitic transistor.

Other Preferred Embodiments

In the foregoing embodiments, for element separation, the LOCOS separation method using mask of two-layer structure of nitride film and oxide film is shown, but similar effects are also obtained by LOCOS separation by using a mask of three-layer structure of nitride film, polysilicon, and oxide film.

Not limited to LOCOS separation, similar effects are expected by, for example, a mesa separation method of separating the element by removing the semiconductor layer by dry etching or the like.

While the invention has been shown and described in detail, the foregoing description is in all aspects illustrative and not restrictive. It is therefore understood that numerous modifications and variations can be devised without departing from the scope of the invention.

We claim:

1. A semiconductor device comprising:

(a) a semiconductor layer;

(b) an insulating film formed beneath said semiconductor layer;

(c) a high impurity concentration region extending from said insulating film, said high impurity concentration region having a higher impurity concentration than an impurity concentration of said semiconductor layer; and (d) a separating region for partitioning said semiconductor layer into activation regions;

wherein said high impurity concentration region extends through an intersection of said insulating film and said activation regions and through an intersection of said separating region and said activation regions into said separating region and said high impurity concentration region is directly above said insulating film in said separating region.

2. The semiconductor device according to claim 1 further comprising:

an oxide film formed on a side of said separating region at an intersection of said separating region and said activation region.

* * * * *